(12) United States Patent
Nikkhoo et al.

(10) Patent No.: US 8,931,684 B2
(45) Date of Patent: Jan. 13, 2015

(54) INDUCTION BONDING

(71) Applicant: Apple Inc., Cupertino, CA (US)

(72) Inventors: Michael Nikkhoo, San Jose, CA (US); Amir Salehi, San Jose, CA (US)

(*) Notice: Subject to any disclaimer, the term of this patent is extended or adjusted under 35 U.S.C. 154(b) by 0 days.

(21) Appl. No.: 14/200,745

(22) Filed: Mar. 7, 2014

(65) Prior Publication Data

US 2014/0182128 A1    Jul. 3, 2014

Related U.S. Application Data

(63) Continuation of application No. 13/749,645, filed on Jan. 24, 2013.

(60) Provisional application No. 61/616,164, filed on Mar. 27, 2012, provisional application No. 61/611,763, filed on Mar. 16, 2012, provisional application No. 61/610,402, filed on Mar. 13, 2012, provisional application No. 61/608,036, filed on Mar. 7, 2012, provisional application No. 61/590,298, filed on Jan. 24, 2012.

(51) Int. Cl.
| | |
|---|---|
| *B23K 31/02* | (2006.01) |
| *B23K 1/002* | (2006.01) |
| *H01R 43/02* | (2006.01) |
| *H05K 13/00* | (2006.01) |
| *B23K 3/00* | (2006.01) |
| *H05K 3/34* | (2006.01) |
| *H01R 12/53* | (2011.01) |

(52) U.S. Cl.
CPC ........ *H01R 43/0242* (2013.01); *H05K 13/0015* (2013.01); *H01R 43/0249* (2013.01); *B23K 3/00* (2013.01); *H05K 3/3405* (2013.01); *H05K 3/3494* (2013.01); *H01R 43/0207* (2013.01); *H05K 2201/094* (2013.01); *H05K 2201/10287* (2013.01); *H05K 2201/10356* (2013.01); *H05K 2203/101* (2013.01); *H01R 12/53* (2013.01)
USPC ........ 228/102; 228/103; 228/180.5; 219/605; 219/616

(58) Field of Classification Search
None
See application file for complete search history.

(56) References Cited

U.S. PATENT DOCUMENTS

| | | | | | |
|---|---|---|---|---|---|
| 2,926,231 | A | * | 2/1960 | McDowell | 219/605 |
| 3,488,695 | A | * | 1/1970 | Williamson et al. | 228/5.1 |
| 3,941,985 | A | * | 3/1976 | Kawase et al. | 318/569 |
| 4,090,656 | A | * | 5/1978 | Sato et al. | 228/180.1 |
| 4,431,891 | A | * | 2/1984 | Forstner et al. | 219/605 |
| 4,650,391 | A | * | 3/1987 | Adlon et al. | 414/222.04 |
| 4,685,608 | A | * | 8/1987 | Kujas | 228/227 |
| 4,854,493 | A | * | 8/1989 | Fujii et al. | 228/5.7 |
| 4,987,283 | A | * | 1/1991 | Beinhaur et al. | 219/616 |
| 5,042,709 | A | * | 8/1991 | Cina et al. | 228/105 |

(Continued)

FOREIGN PATENT DOCUMENTS

| | | | |
|---|---|---|---|
| FR | 2934799 A1 | * | 2/2010 |
| JP | 2011-096769 A | * | 5/2011 |
| JP | 2011-187691 A | * | 9/2011 |

*Primary Examiner* — Kiley Stoner
(74) *Attorney, Agent, or Firm* — Womble Carlyle Sandridge & Rice, LLP

(57) ABSTRACT

The described embodiment relates generally to the field of inductive bonding. More specifically an inductive heater designed for use in assembling electronics is disclosed. A number of methods for shaping a magnetic field are disclosed for the purpose of completing an inductive bonding process without causing harm to unshielded adjacent electrical components.

10 Claims, 28 Drawing Sheets

(56) References Cited

U.S. PATENT DOCUMENTS

| | | | |
|---|---|---|---|
| 5,093,545 A * | 3/1992 | McGaffigan | 219/616 |
| 5,561,086 A * | 10/1996 | Rostoker | 438/106 |
| 5,730,630 A * | 3/1998 | Lacourse et al. | 439/876 |
| 5,806,179 A * | 9/1998 | Hassanzadeh | 29/860 |
| 5,911,354 A * | 6/1999 | Chou | 228/6.2 |
| 5,971,812 A * | 10/1999 | Martin | 439/676 |
| 5,984,165 A * | 11/1999 | Inoue et al. | 228/180.22 |
| 6,006,980 A * | 12/1999 | Lacourse et al. | 228/180.21 |
| 6,188,052 B1 * | 2/2001 | Trucco | 219/603 |
| 6,236,029 B1 * | 5/2001 | Leurquin | 219/616 |
| 6,283,355 B1 * | 9/2001 | Ma et al. | 228/44.3 |
| 6,357,648 B1 * | 3/2002 | Monno | 228/19 |
| 7,259,088 B2 * | 8/2007 | Lehner | 438/618 |
| 8,186,041 B1 * | 5/2012 | Walker et al. | 29/747 |
| 2002/0050246 A1 * | 5/2002 | Parkhe | 118/500 |
| 2004/0035907 A1 * | 2/2004 | Radeck | 228/41 |
| 2004/0112943 A1 * | 6/2004 | Monson et al. | 228/180.21 |
| 2005/0199615 A1 * | 9/2005 | Barber et al. | 219/672 |
| 2006/0086718 A1 * | 4/2006 | Fukamachi et al. | 219/616 |
| 2007/0068998 A1 * | 3/2007 | Silliman et al. | 228/179.1 |
| 2008/0035627 A1 * | 2/2008 | Statnikov et al. | 219/158 |
| 2008/0164248 A1 * | 7/2008 | Reul | 219/617 |
| 2008/0197168 A1 * | 8/2008 | Horino et al. | 228/8 |
| 2008/0296277 A1 * | 12/2008 | McAninch | 219/136 |
| 2009/0266811 A1 * | 10/2009 | Kimbara | 219/616 |
| 2009/0321131 A1 * | 12/2009 | Yamamoto | 174/72 A |
| 2010/0038358 A1 * | 2/2010 | Dingle et al. | 219/616 |
| 2010/0243716 A1 * | 9/2010 | Kuczynski et al. | 228/176 |
| 2011/0163085 A1 * | 7/2011 | Kalmbach et al. | 219/616 |
| 2011/0306235 A1 * | 12/2011 | Tanaka et al. | 439/578 |

\* cited by examiner

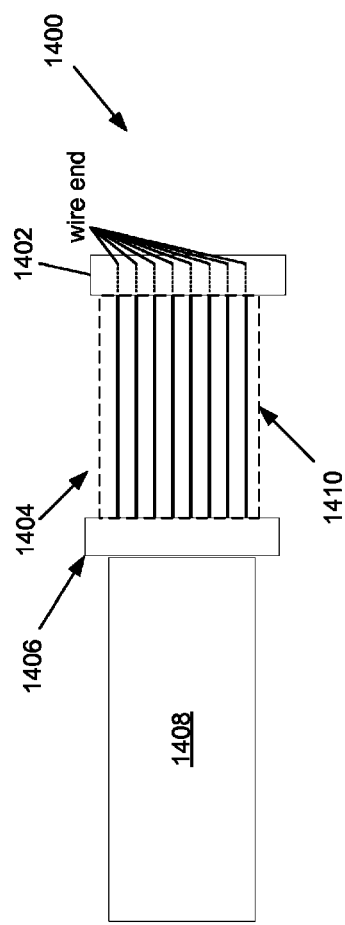
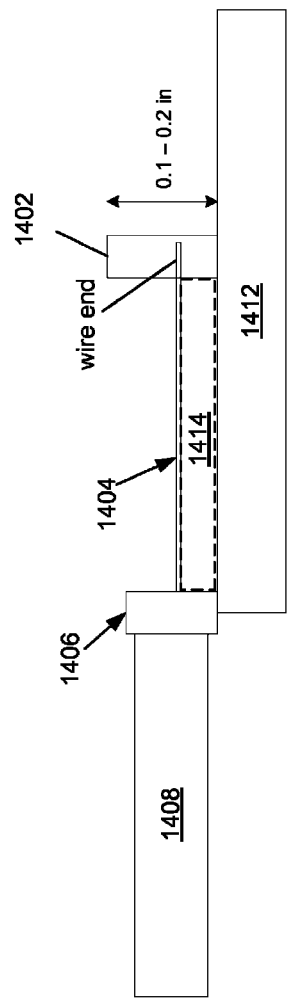

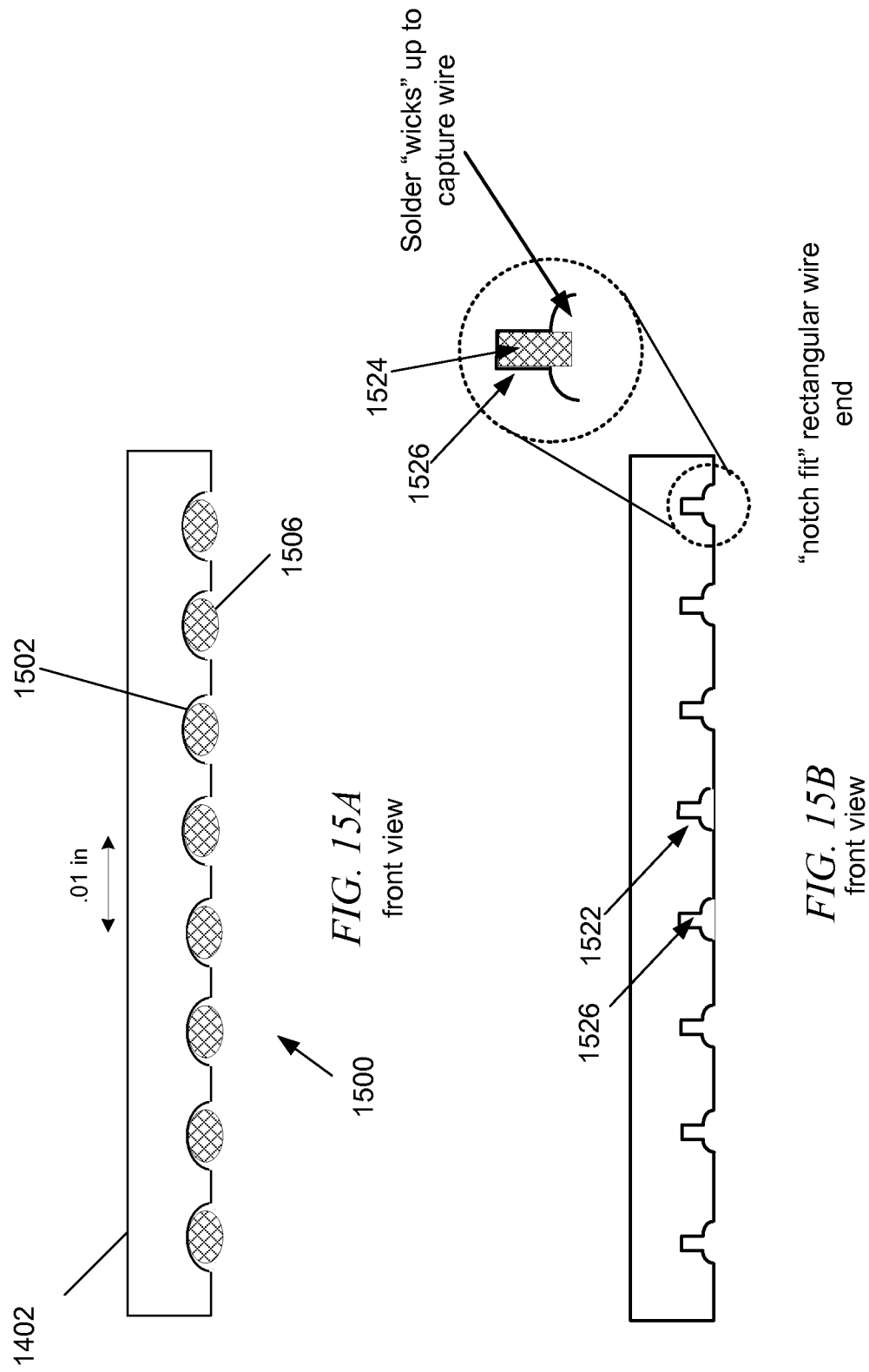

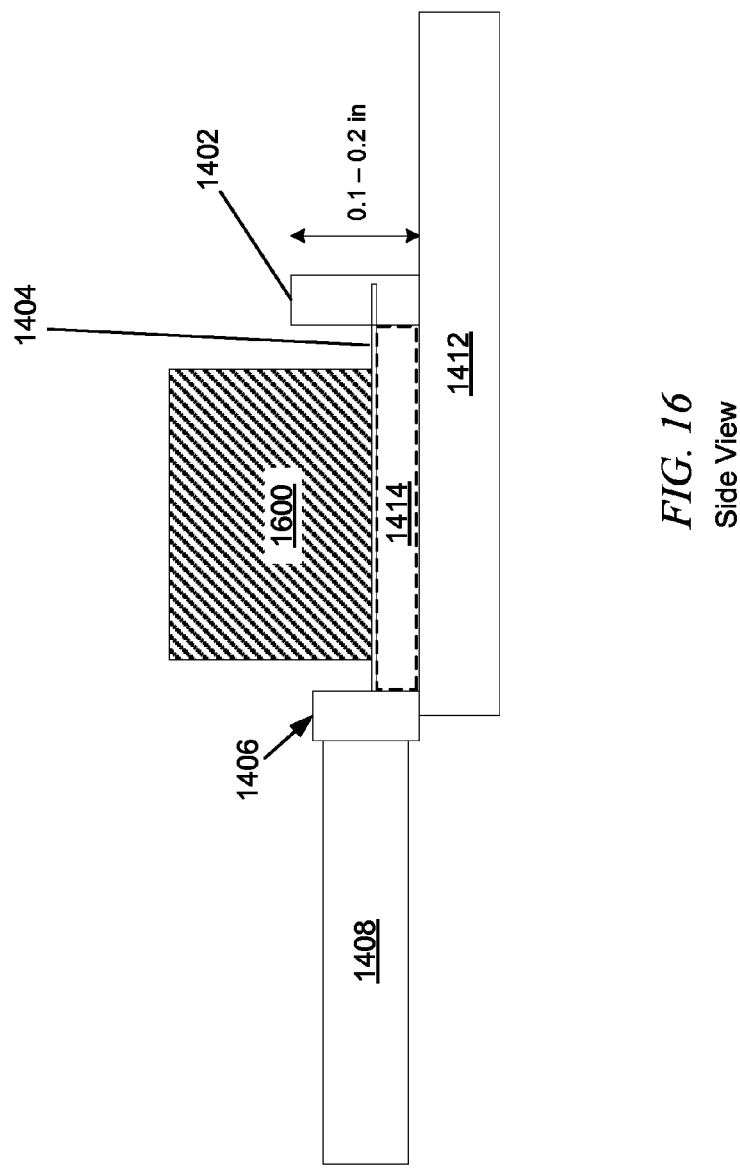

INDUCTION BONDING

CROSS-REFERENCE TO RELATED APPLICATIONS

This application is a continuation of U.S. patent application Ser. No. 13/749,645, filed Jan. 24, 2013 and entitled "INDUCTION BONDING", which is incorporated by reference in its entirety for all purposes. This patent application is also related to and incorporates by reference in their entireties for all purposes the following provisional patent applications:
(i) U.S. Provisional Application Ser. No. 61/590,298 entitled "INDUCTION BONDING" by Nikkhoo, filed Jan. 24, 2012;
(ii) U.S. Provisional Application Ser. No. 61/608,036 entitled "INDUCTION BONDING" by Nikkhoo et al, filed Mar. 7, 2012;
(iii) U.S. Provisional Application Ser. No. 61/610,402 entitled "INDUCTION BONDING" by Nikkhoo et al, filed Mar. 13, 2012;
(iv) U.S. Provisional Application Ser. No. 61/611,763 entitled "INDUCTION BONDING" by Nikkhoo et al, filed Mar. 16, 2012; and
(v) U.S. Provisional Application Ser. No. 61/616,164 entitled "INDUCTION BONDING" by Nikkhoo et al, filed Mar. 27, 2012.

FIELD

The described embodiment relates generally to the use of an induction coil in electronics manufacturing.

BACKGROUND

One common way to affix wires to a printed circuit board (PCB) is with a hot press. Wires are laid on top of a PCB pad with a certain amount of solid adhesive applied on the PCB pad. A pneumatic arm presses a heated pad down on to the wires and adhesive, melting the adhesive and embedding the wires within the adhesive. Unfortunately, to accomplish this with a high degree of reliability the tolerances on the hot press must be quite precise. Both the distance the arm brings the heated pad down, and the pressure with which it pushes into the wire and adhesive, must be quite accurate. Consequences of inaccuracies include breakage of the PCB, and improper adhesion of the wires. The cost of machinery capable of delivering the requisite tolerances needed to make this manufacturing technique reliable is quite high.

Therefore what is desired is a manufacturing tool capable of attaching the wires to the PCB pad in a reliable repeatable way at a lower overall cost.

SUMMARY

In a first embodiment a method of bonding a first stranded wire and a second stranded wire to a printed circuit board (PCB) is disclosed. The first stranded wire has a first diameter greater than a second diameter of the second stranded wire. The method includes at least the following steps: (1) forming a first solder bump on a first PCB pad and a second solder bump on a second PCB pad having first and second solder bump height dimensions, the first solder bump height dimension being less than the second solder bump height dimension; and (2) arranging the first stranded wire on the first solder bump and the second stranded wire on the second solder bump. A resulting vertical position with respect to the PCB of a top surface of the first stranded wire is about the same as a vertical position of a top surface of the second stranded wire.

In another embodiment a horizontal wire comb configured to align a number of stranded wires is disclosed. The horizontal wire comb includes at least a comb body having a height dimension substantially less than a width dimension. The comb body includes a number of notches extending into the comb body. Each one of the notches has a size and shape in accordance with a corresponding one of the stranded wires. The comb body has a height about the same as an overall height of each of the stranded wires.

In yet another embodiment an apparatus for positioning a number of stranded wires on a printed circuit board (PCB) during a bonding operation is disclosed. The apparatus includes at least the following: (1) a printed circuit board (PCB) nest configured to support the PCB, the PCB nest including a wire routing assembly configured to align a plurality of stranded wires with a reference datum; and (2) a horizontal wire comb disposed on a top surface of the PCB. The horizontal wire comb includes a comb body having a height dimension substantially less than a width dimension. The comb body includes a number of notches extending into the comb body, each one of the notches having a size and shape in accordance with a corresponding one of the stranded wires. The comb body has a height about the same as an overall height of each of the stranded wires.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

FIGS. 14A-17 show various embodiments of wire comb used in an induction wire attach system in accordance with the described embodiments.

DETAILED DESCRIPTION

Figure 1:
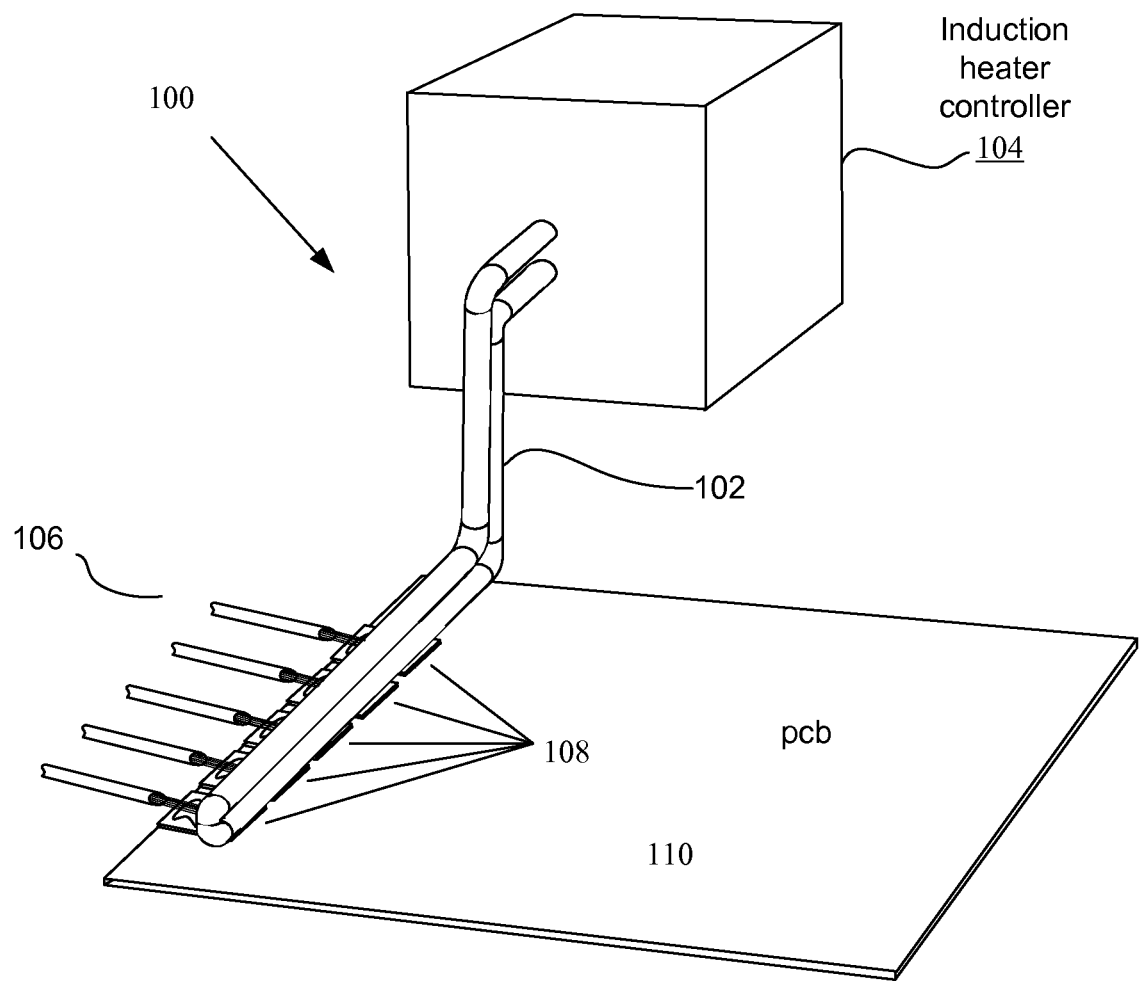
FIG. 1 shows a perspective view of one possible configuration of an induction heater in accordance with the described embodiment.

A representative apparatus and application of methods according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Surface mounting techniques often involve the use of printed circuit board (PCB) pads to assist in mounting components to the surface of a PCB. Surface mounting techniques have advantages when compared with through hole attachment techniques. In particular using a PCB pad allows the number of holes in a PCB to be minimized, reducing the cost of the PCB and making it easier to run electrical traces throughout the board. In smaller scale manufacturing operations electrical leads can be simply soldered to the top of the PCB pad, by heating up the PCB with a soldering iron and then slowly applying solder to the surface of the PCB pad which melts the solder thereby adhering to the wire leads. In large scale manufacturing operations it simply isn't feasible to manually solder pieces to leads onto a PCB pad. One way to adapt this process to mass production is to use a hot press to accomplish the same end state. A hot press can be used that includes a mechanical arm to press a heated bar into a pre-placed set of wire leads and solder paste arranged on top of a PCB pad. By exerting a specific amount of pressure, for a long period of time, at the right temperature, a strong reliable connection can be made between the lead wires and the PCB pad. Unfortunately, tolerances in complex electronic configurations can be quite tight. Minor inconsistencies in pressure, heat, or even position can result in faulty connections and unacceptably high percentages of unusable end products. Manufacturing machines that do have the fine control capability necessary to achieve consistent results can be prohibitively expensive. One way to reduces some of the fine control problems inherent in a hot press configuration is to design a configuration that substantially reduces the need for high pressure that must be applied to the heating element and other the electrical components. Eddy currents in any nearby conductive objects thereby generating heat in those conductive objects. Induction heating is the process of heating an electrically conducting object (usually a metal) by electromagnetic induction, where eddy currents are generated within the metal and resistance leads to Joule heating of the metal. An induction heater can include an electromagnet, through which a high-frequency alternating current (AC) is passed. Heat may also be generated by magnetic hysteresis losses in materials that have significant relative permeability. The frequency of AC used depends on the object size, material type, coupling (between the work coil and the object to be heated) and the penetration depth.

FIG. 1 shows a perspective view of one possible configuration of induction heater 100 in accordance with the described embodiment. In FIG. 1 induction coil 102 is coupled to induction heater controller 104. Induction coil 102 typically carries an AC current to and from induction heater controller 104. In one embodiment, induction heater controller 104 can be realized as a high frequency (greater than 700 KHz) AC power supply. While induction coil 102 is shown shaped as a tight parallel coil, it should be understood that any number of other shapes are also possible as alternate configurations can change the shape and strength of the magnetic field to properly match the target of the induction heating. As shown in FIG. 1, induction coil 102 can cross over wires 106 and be shaped so that the return path of induction coil 102 is further away (in this embodiment vertically further) from PCB 110. In this way the shape can help focus any induced eddy currents (and thus focus induction heating) locally to the area where wires 106 are to be bonded. In some embodiments, induction coil 102 can exert a force of between 10 to 20 PSI onto wires 106. The applied force can help to flatten and properly position wires 106 against PCB Pads 108 during the bonding process. In other embodiments, induction coil 102 can induce eddy currents within the wires and PCB pads 108 on PCB 110 to heat and solder wires 106 to PCB 110 without contacting either wires 106 or PCB 110. In other words, eddy currents can be induced at a distance without physical contact between induction coil 102 and wires 106 or PCB 110. The magnetic field emanating from induction heater 100 can be designed so that the heating of components is limited to the area of wires 106 and related PCB pads 108. Other areas of PCB 110 can remain relatively cool and not be subjected to heating.

Figure 2A:
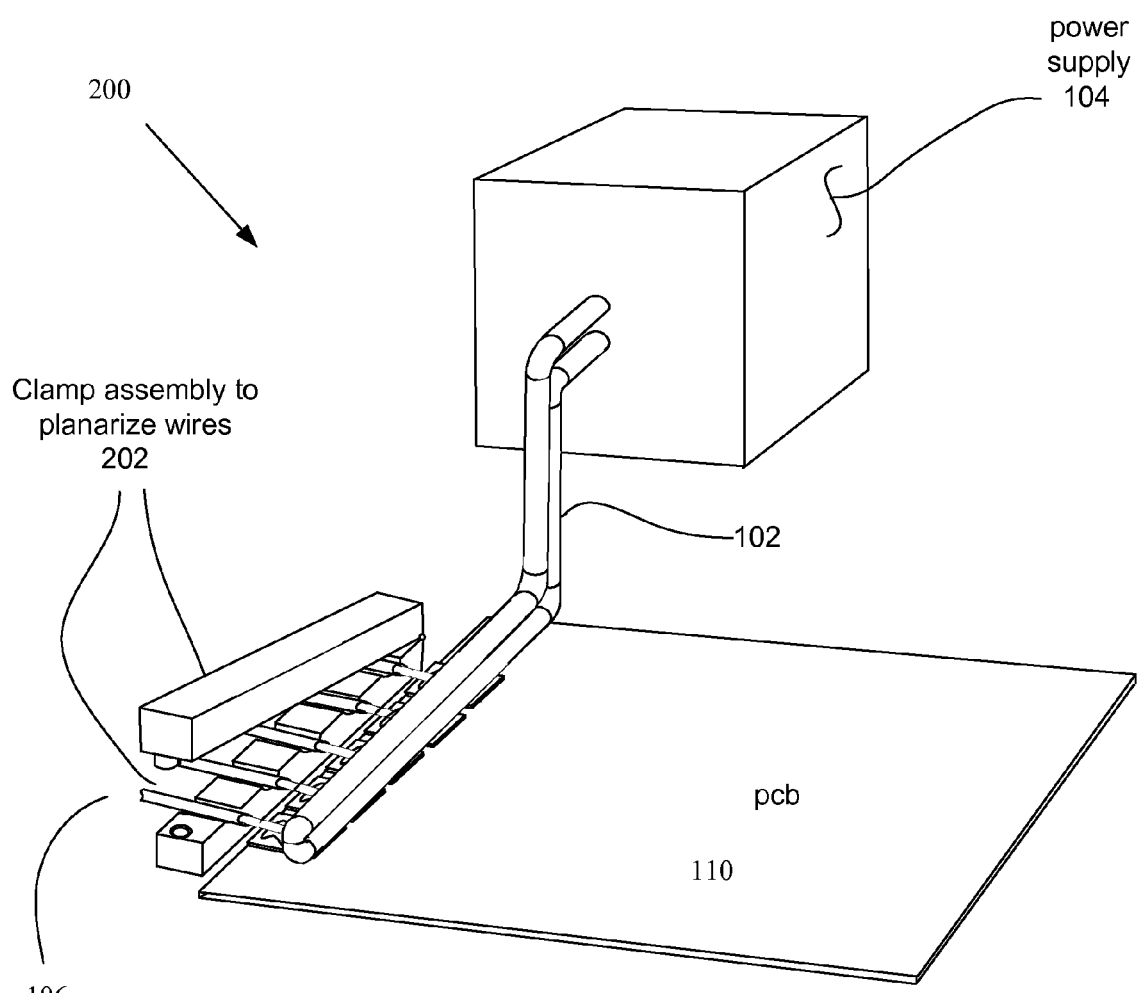
FIG. 2A shows a perspective view of another possible configuration of an induction heater in accordance with the described embodiment.
Figure 2B:
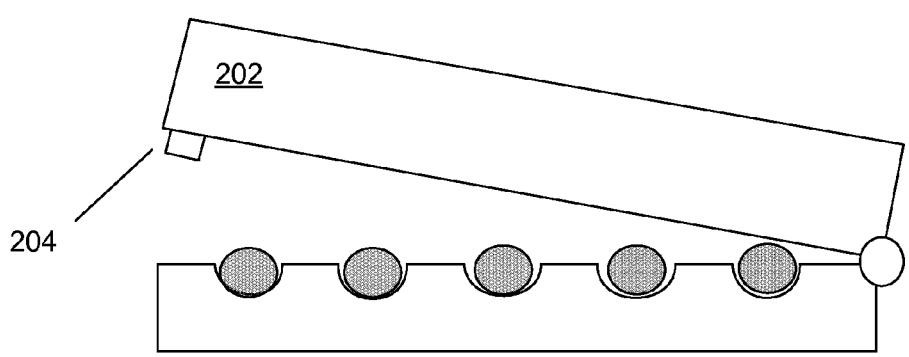
FIG. 2B is a cross sectional view of a wire clamp assembly.

FIG. 2A shows a perspective view of another possible configuration of induction heater 100 in the form of induction heater 200 in accordance with the described embodiment. PCB 110, induction coil 102 and induction heater controller 104 can be similar to the like elements shown in FIG. 1. Included in induction heater 200 is clamp 202. Clamp 202 can position and hold wires 106 securely prior to heating by induction coil 102. Although shown as two pieces here, clamp 202 can include any number of pieces. Clamp 202 can orient and planarize wires 106 prior to heating and soldering by induction coil 102. Clamp 202 can be made from aluminum, plastic or any other durable, rigid and preferably non-metallic material. In addition to holding wires 106, clamp 202 can help control and correct wire position errors, such as errors in pitch, yaw and roll. These errors are described further in conjunction with FIG. 7. FIG. 2B shows a cross sectional view of clamp 202. In this view boss 204 can be clearly seen. Boss 204 ensures that clamp 202 puts a consistent amount of pressure across all of the planarized wires by stopping the clamp in a specific position when it is in a closed position. In this way boss 204 precisely regulates the pressure applied by the clamp, thereby reducing any potential damage caused by placing an undue amount of pressure on the wires.

Figure 3A:
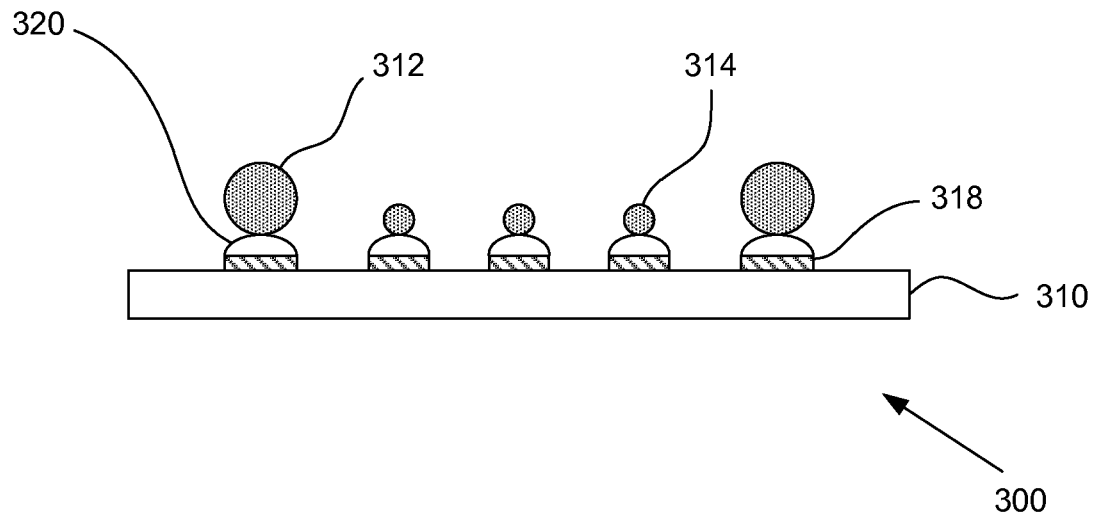
FIGS. 3A and 3B are cross sectional views of a PCB and wire assembly.
Figure 3B:
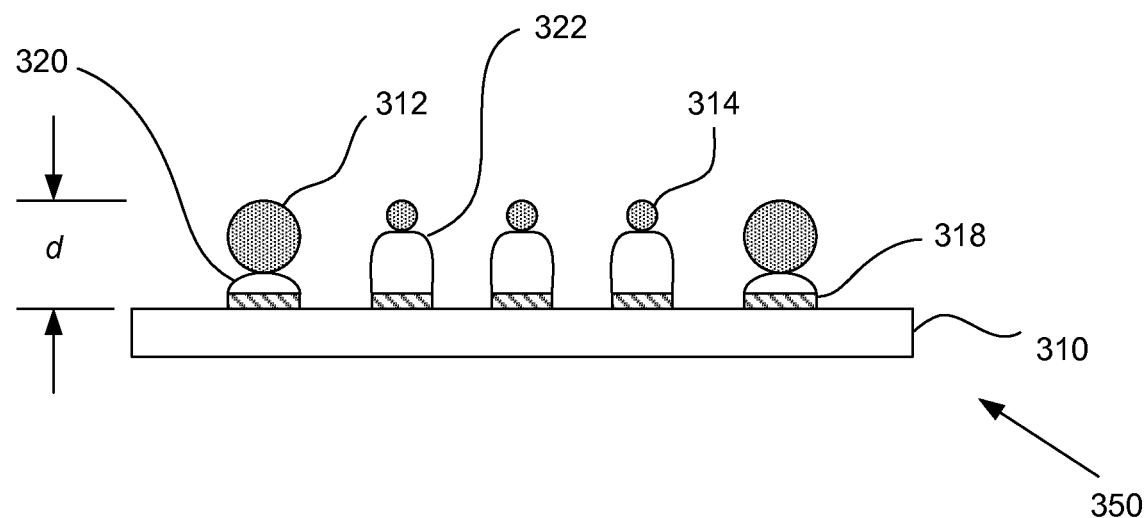

FIGS. 3A and 3B show cross sectional views of PCB and wire assemblies. FIG. 3A illustrates one difficulty encountered when PCB assembly 300 includes wires of at least two different diameters. PCB 310 includes pads 318 to receive wires 312 and 314. Typically solder bump 320 is disposed on top of pads 318. Solder bumps 320 can be shaped and hardened prior to placing wires 312, 314 on top of them. In this way solder bumps 320 can have a consistent and repeatable height and shape rather than an amorphous shape that would create undesirable uncertainties when designing the magnetic field. Unfortunately, as can be seen in FIG. 3A, larger wires such as wire 312 are taller and possess surfaces more distant from PCB 310 compared to smaller wires such as wire 314. In other words, wires of varying diameters can present an uneven surface that can make an induction heating process more difficult. An uneven surface makes the heating process more difficult because wires positioned farther from the induction coil receive less energy and consequently may not reach a temperature sufficient to create a reliable bond.

Varying wire diameters can be accommodated as shown in PCB assembly 350 in FIG. 3B. PCB 310 has pads 318 to receive wires 312 and 314. Wires 312 and 314 should be a substantially uniform distance from PCB 310 to enable uniform heating from induction coil 102. That is, wires 312 and 314 should present a relatively even upper surface. By arranging the upper surface at an even vertical height a consistent amount of heat can be provided to each of the wires. In this example, the tops of wires 312, 314 are a distance d from PCB 310. To control distance d of varying diameter wires, the height of solder bumps 320 and 322 can change in accordance with the diameter of wires 312, 314. As shown, smaller wire 314 can be placed on larger solder bump 322. In contrast, larger wire 312 can be placed on smaller solder bump 320. By varying solder bump heights (solder bump height is the vertical distance between the top of each pad 318 and the lower surface of each bundle of wires) the height of the wires 312 and 314 with respect to PCB 310 can be controlled. The solder bumps 320 can substantially reduce or eliminate any gap that can be present between an induction coil and wires such as induction coil 102 and wires 106 in FIG. 2.

Figure 4:
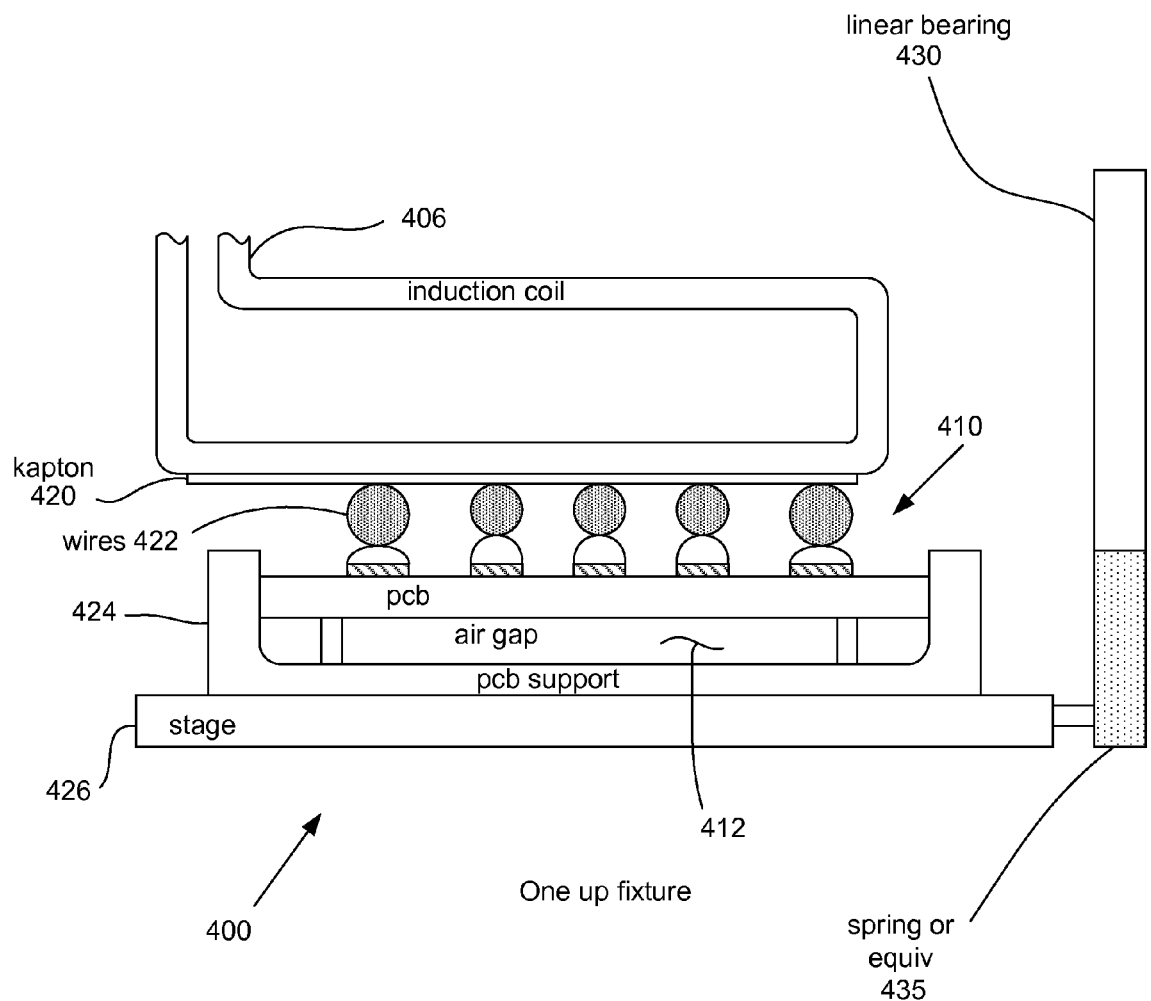
FIG. 4 is a cross sectional view of an induction heater system.

FIG. 4 is a cross sectional view of an induction heater system 400. In this embodiment, one PCB assembly 410 (including PCB, pads, solder bumps and wires) is positioned in PCB support 424. PCB support 424 can support PCB assembly 410 such that air gap 412 is below PCB assembly 410. The presence of air gap 412 in conjunction with air above PCB assembly 410 can help control the buildup of heat by carrying hot air away from PCB assembly 410. Reducing heat can help prevent damaging heat sensitive parts that can also be mounted on PCB 410 such as integrated circuits, memory, or the like. In one embodiment, cooling air can be forced by a fan or other equivalent means through the air gap 412 and over PCB assembly 410. In another embodiment, PCB assembly 410 can be cooled by convection currents both within air gap 412 and above PCB assembly 410. Thus, other components mounted on PCB assembly 410 can remain relatively cooler than wires 422.

PCB support 424 can be mounted on stage 426. In one embodiment stage 426 can move (vertically as shown here) to place PCB assembly 410 in contact with induction coil 406. Stage 426 can be positioned by linear bearing 430. Spring 435 can be used to maintain a controlled amount of pressure between wires 422 and induction coil 406. In other embodiments, other compliant force providers can be used such foam, rubber or the like. In one embodiment, pressure between wires 422 and induction coil 406 is between 10 and 20 PSI. Tape 420, such as Kapton™ tape, or other solder resistive material can be positioned on induction coil 406 such that when induction coil 406 comes in contact with wires 422 only tape 420 comes in contact with wires 422. Tape 420 can prevent solder from wicking up through wires 422 and subsequently sticking to induction coil 406. Thus, when the heating cycle is complete, PCB assembly 410 moves away easily from induction coil 406.

Figure 5:
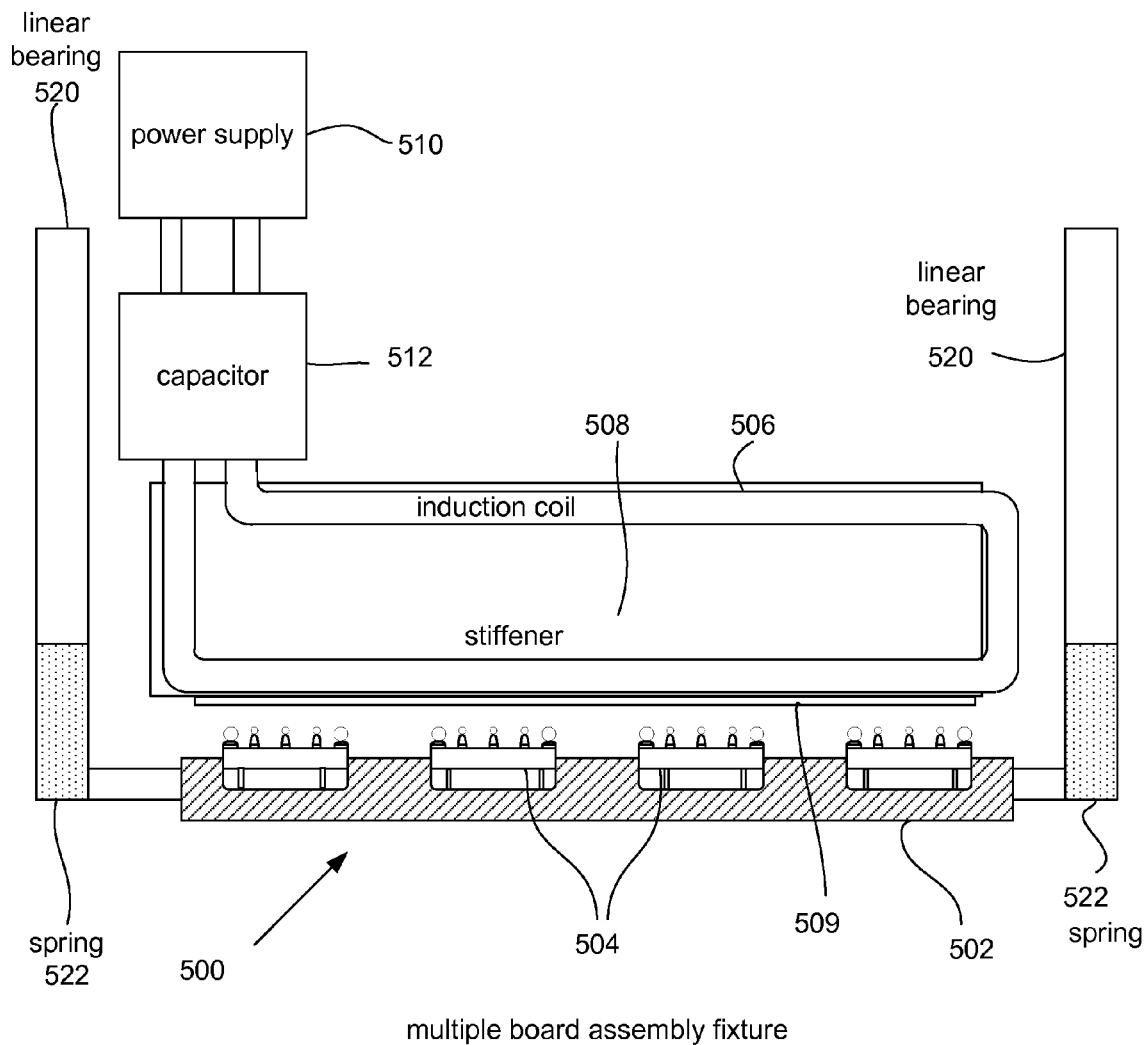
FIG. 5 is a cross sectional view of another embodiment of an induction heater system.

FIG. 5 is a cross sectional view of another embodiment of induction heater system 500. Induction heater system 500 is configured to process more than one PCB assembly 504. Although only 4 PCB assemblies 504 are shown here, any number of multiple assemblies can be supported with appropriate designs of PCB support 502. To accommodate more PCB assemblies 504, induction coil 506 can be made longer. A longer induction coil 506 may suffer uneven deflection as PCB support 502 moves to place PCB assemblies 504 in contact with longer induction coil 506. Deflection can be even more of a problem when in addition to lengthening induction coil 506, induction coil 506 is made of thin piping in some cases with a diameter of about 3 mm. To prevent and/or reduce deflections, stiffener 508 can surround a majority of a horizontal portion of longer induction coil 506. Stiffener 508 can be made of a hard, non-magnetic material such as a ceramic made of aluminum oxide ($Al_2O_3$) or Zirconium. In other embodiments stiffener 508 could be made from plastic material, glass or even quartz. Glass and Quartz material both advantageously have the beneficial property of being optically clear, and non-conductive. Use of quartz or glass as the stiffener 508 material could remove the need for Tape layer 509 to be applied to a bottom surface of stiffener 508. Longer induction coil 506 can place greater electrical loads on power supply 510. Adding capacitor 512 between longer induction coil 506 and power supply 510 can enhance the performance of inductor coil 506 by smoothing out voltage variations and providing a temporary current buffer to handle current transients caused by longer induction coil 506. PCB support 502 may be extended in size (compared to PCB support 424 of FIG. 4) to support more than one PCB assembly 504 as illustrated. In some embodiments, additional linear bearings 520 and springs 522 can be used to support and guide PCB support 502.

Figure 6:
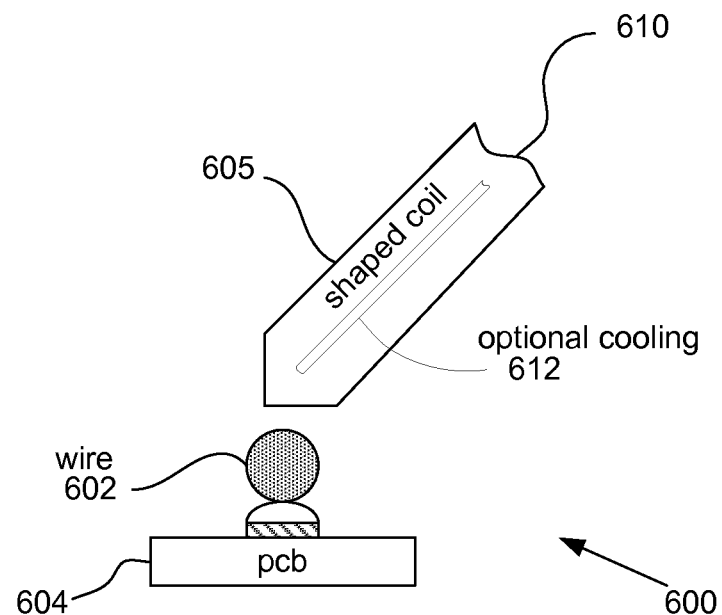
FIG. 6 is a cross sectional view of yet another embodiment of an induction heater system in the shape of a stylus.

FIG. 6 is a cross section view of yet another embodiment of an induction heater system in the shape of a stylus. In particular, induction heater stylus 600 can include body 605 enclosing induction coil 610. In this embodiment, induction coil 610 can be shaped to have a finer point, especially when compared to induction coil 406 in FIG. 4 and induction coil 506 in FIG. 5. Shaping induction coil 610 can create a relatively fine and narrow electric field. Such an induction coil can focus the electric field to relatively small features such as single wire 602 on PCB 604. In some embodiments, induction coil 610 can include channels, passage ways and the like to pass cooling fluids through the induction coil 610. Cooling fluids can be liquid such as water or cooling oil, or cooling fluids can be air.

Figure 7:
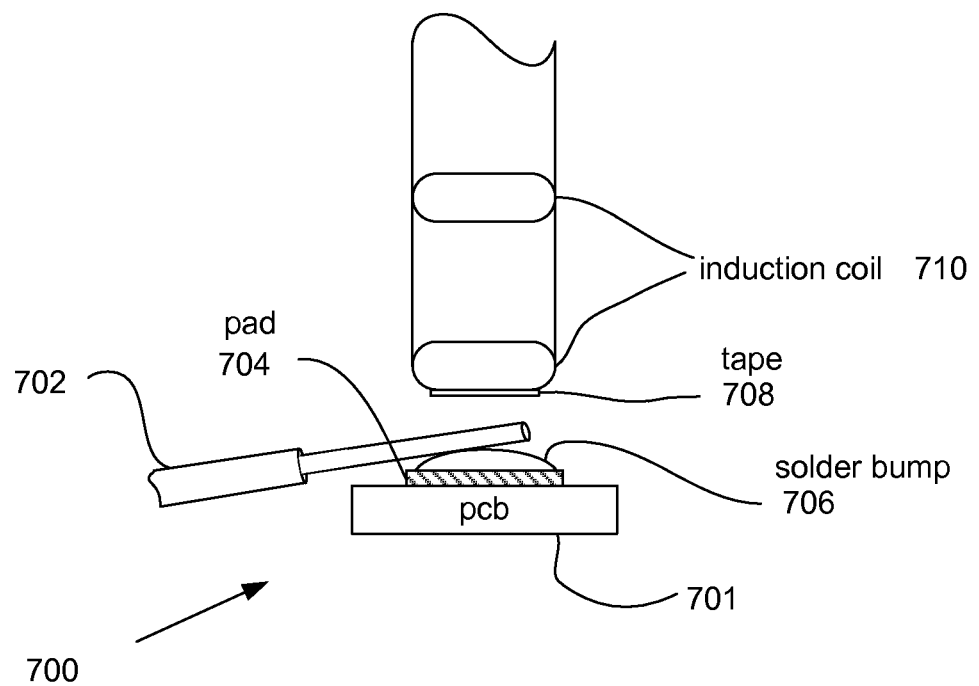
FIG. 7 is a cross sectional view of still another induction heater system.

FIG. 7 is a cross sectional view of an induction heater system 700. This view illustrates a possible relationship between wire 702, PCB 701 and induction coil 710. Pad 704 is affixed to PCB 701. Solder bump 706 can be placed on pad 704 in a manner as described in FIG. 3. Wire 702 can be subject to pitch, roll and yaw alignment errors as wire 702 is placed on solder bump 706. Pressure can be exerted between induction coil 710 (through tape 708) and wire 702 to try to correct alignment errors as solder bump 706 melts and reflows. In one embodiment, between 10 and 20 PSI can be exerted between induction coil 710 and wire 702/PCB 701.

Figure 8:
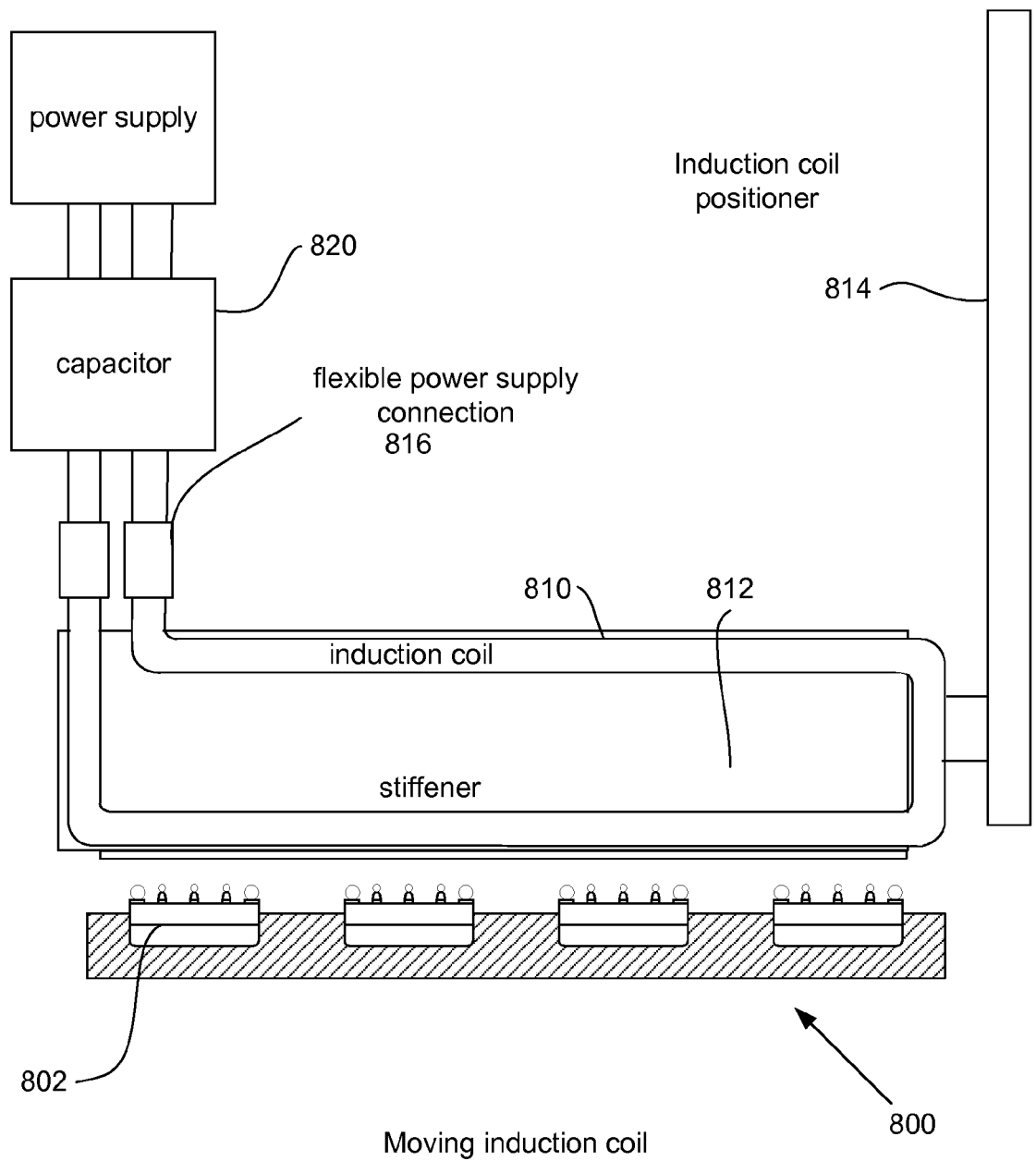
FIG. 8 is a cross sectional view of an embodiment of an induction heater system with a moving induction coil.

FIG. 8 is a cross sectional view of an embodiment of an induction heater system 800 with a moving induction coil. In contrast to previously described induction heater systems, induction heater system 800 can be configured to move induction coil 810 rather than PCB assemblies 802 to place induction coil near PCB assemblies 802. Induction coil 810 can still include stiffener 812 to increase stability. In one embodiment, a flexible power supply connection 816 can be disposed between induction coil 810 and capacitor 820. In one embodiment, flexible power supply connection 816 can be a waveguide. In one embodiment, induction coil 810 can be positioned by induction coil positioner 814. Induction coil positioner 814 can be a lead screw, linear bearing or other like positioning device.

Figure 9:
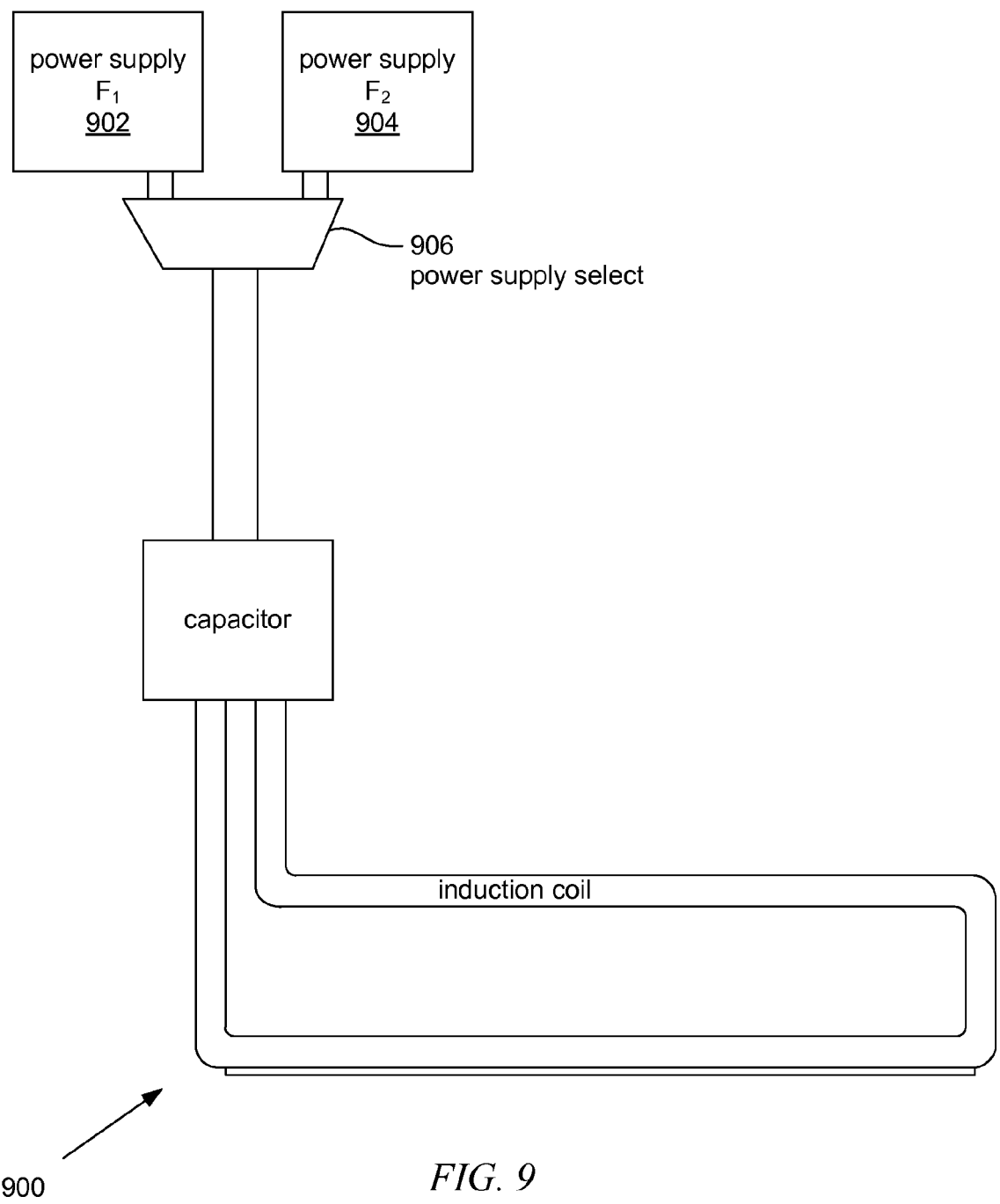
FIG. 9 is a block diagram of an embodiment of an induction heater system with more than one power supply.

FIG. 9 is a block diagram of an embodiment of an induction heater system 900 with more than one power supply. As shown, induction heater system 900 can include first power supply 902 and second power supply 904. First power supply 902 can have a first alternating frequency F1 and second power supply 904 can have a second alternating frequency F2. In some instances, a particular power supply frequency can have particular induction heating characteristics especially for a given induction coil shape and a given component shape. Thus, selecting a particular alternating frequency can be advantageous for a given component, component size, wire size or other like situation when the amount of electric field as well as the penetration depth of the electric field could be well controlled. In this embodiment, the output of first power supply 902 or second power supply 904 can be selected with power supply selector 906. Power supply selector 906 can couple the selected power supply to the inductor coil. In other embodiments, functionality of first power supply 902 and second power supply 904 can be combined into a single configurable power supply. Such a power supply can have an adjustable alternating frequency. In such an embodiment, only single power supply may be necessary and power supply selector 906 can be eliminated. In still other embodiments, each power supply can be coupled to a dedicated induction coil. Thus, two power supplies and two induction coils can operate in parallel. Such an arrangement may be useful when two particularly disparate and different components are required to be soldered. The induction heating can be tailored to each component.

Figure 10:
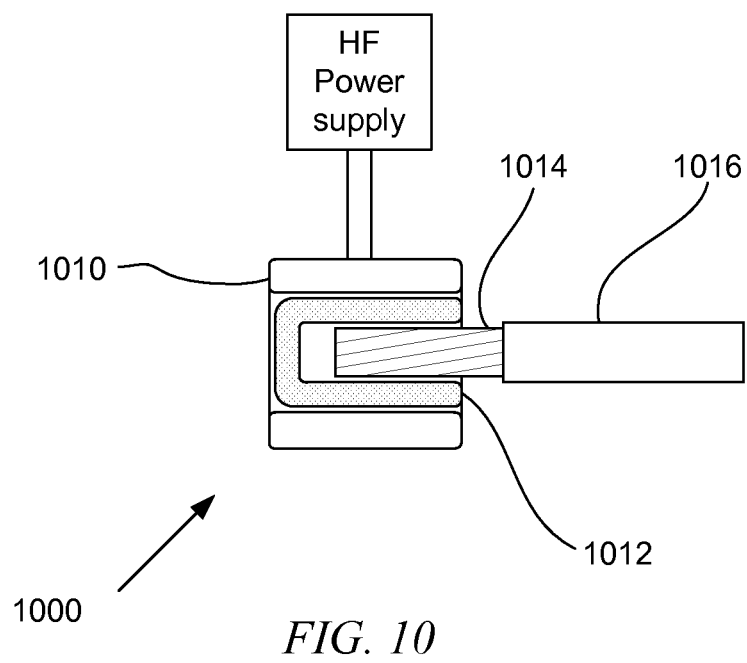
FIG. 10 is a block diagram of a wire end forming device.

FIG. 10 is a block diagram of a wire end forming device 1000. Wire forming device 1000 works along the same principles of induction heating systems as described above. The wire end forming device 1000 can be used to carefully heat the wire end 1014 of a wire 1016. An effective amount of solder paste or similar substance can be applied to wire end 1014. Wire end 1014 can be placed into wire end forming mold 1012. AC current can be applied to induction coil 1010 thereby heating the wire end 1014 and melting applied solder paste. After the wire end 1014 cools, wire end 1014 is made more robust.

Figure 11:
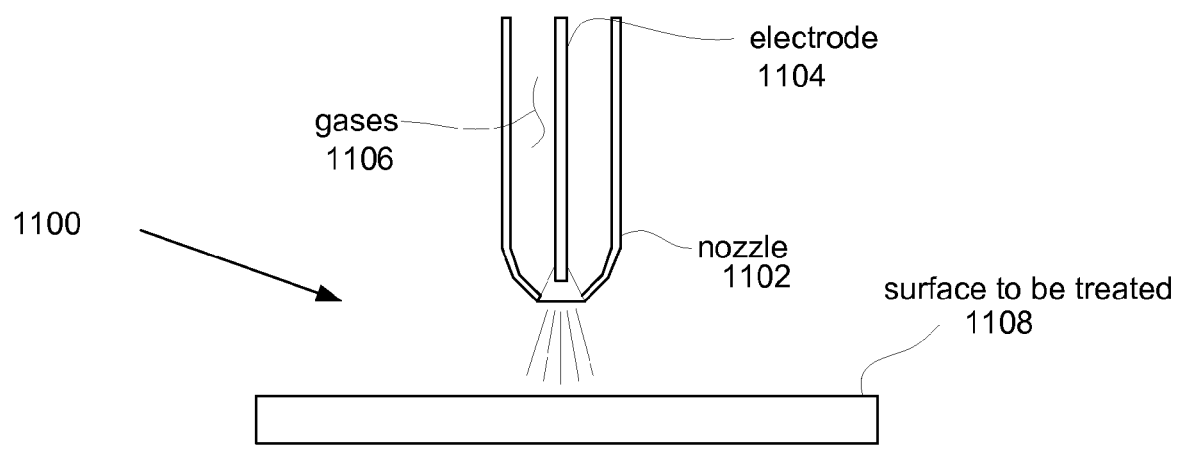
FIG. 11 is a block diagram of a surface preparation device.

FIG. 11 is a block diagram of a surface preparation device 1100. The device 1100 includes nozzle 1102. Nozzle 1102 can direct highly ionized gasses 1106 onto a surface 1108. Gasses 1106 can be air, oxygen, nitrogen or other gasses. The gasses 1106 can be ionized by electrode 1104. In some embodiments, electrode 1104 can have several thousand volts applied. The resulting ionized gas can modify a portion of the surface 1108. In some embodiments, treating surface 1108 with ionized gases can increase adhesive properties of surface 1108.

Figure 12A:
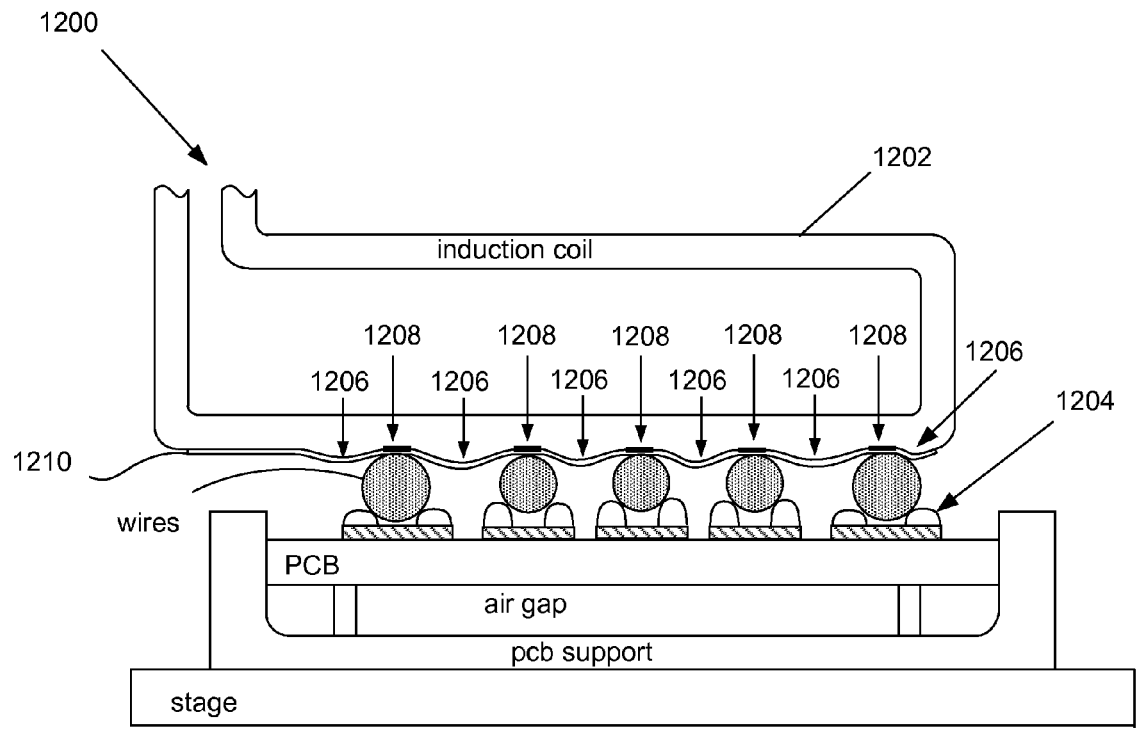
FIG. 12A is a cross sectional view of another induction heater system including modifications for better wire alignment and bonding.

FIG. 12A is a cross sectional view of yet another embodiment of induction heater system 1200. As induction coil 1202 presses on the wires small strands of wire can have a tendency to spread to one side or the other, tending to cause unpredictable placement of the wires on the PCB pad. In this embodiment solder bumps 1204 have been split into separate bumps. By leaving a channel between the solder bumps the wires can rest in a stable position between the bumps as they are brought into contact with induction coil 1202. Another way to further improve wire placement on the PCB pad is by adding ridges 1206 to the bottom surface of induction coil 1202. Ridges 1206 can be machined, into the underside of the induction coil as shown. In embodiments where induction coil 1202 is substantially encased in a stiffener, ridges 1206 can be laser etched or chemically etched into the bottom surface of the stiffener as opposed to into induction coil 1202 itself. Ridges 1206 further refine the position of the wires on the PCB pad as the wires are squeezed between induction coil 1202 and solder bumps 1204. Magnetic concentrators 1208 can be embedded into a bottom surface of induction coil 1202. Magnetic concentrators 1208 can assist in the shaping of the magnetic field emanating from induction coil 1202, thereby improving the speed and efficiency of the induction bonding operation. Finally, solder-phobic layer 1210 (in one embodiment solder-phobic layer 1210 can be made of Kapton™ tape) can be added to embodiments of the induction coil which do not include a stiffener with a solder-phobic surface.

Figure 12B:
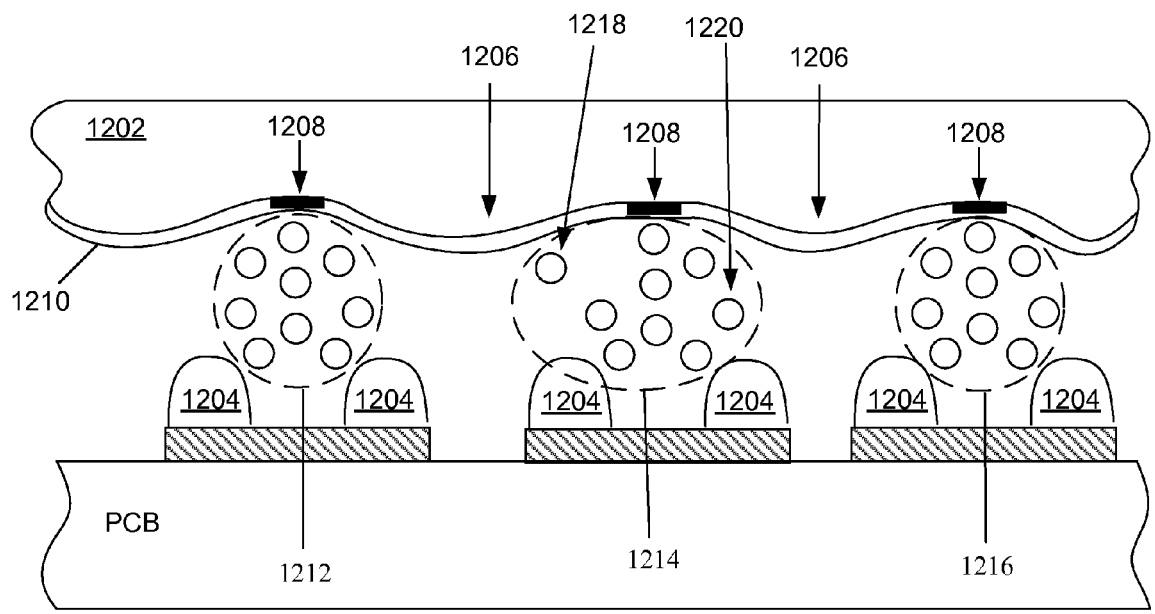
FIG. 12B is a close up view of the induction heater system of illustration 12A, showing the benefits of physical alignment guides.

FIG. 12B shows a close up view of induction coil 1202 coming into contact with stranded wires 1212, 1214, and 1216. This close up view allows an illustration of possible wire misalignment. Since each individual wire can be at times as narrow as 7 microns in diameter it does not take much force to disturb the positioning of an individual wire. Likewise in cases where individual wires are offset laterally a little force can move them into position. In the case of stranded wire 1214, individual wire 1218 is offset laterally from the other individual wires in stranded wire 1214 and without realignment may not bond properly with its associated PCB pad. As induction coil 1202 begins to come into physical contact with stranded wire 1214 one of ridges 1206 can come into contact with individual wire 1218; ridge 1206 can then push individual wire 1214 back towards the center of its associated PCB pad. Similarly, separated adhesive bumps 1204 serve a similar purpose to ridges 1206. By leaving a channel separating adhesive bumps 1204 some wires, such as individual wire 1220 biased towards the edge of the PCB Pad can be influenced towards the center of the PCB Pad by virtue of the slope of solder bump 1204 beneath it. Proper alignment of the wires can play an important role in increasing the reliability of resulting welds.

Figure 13:
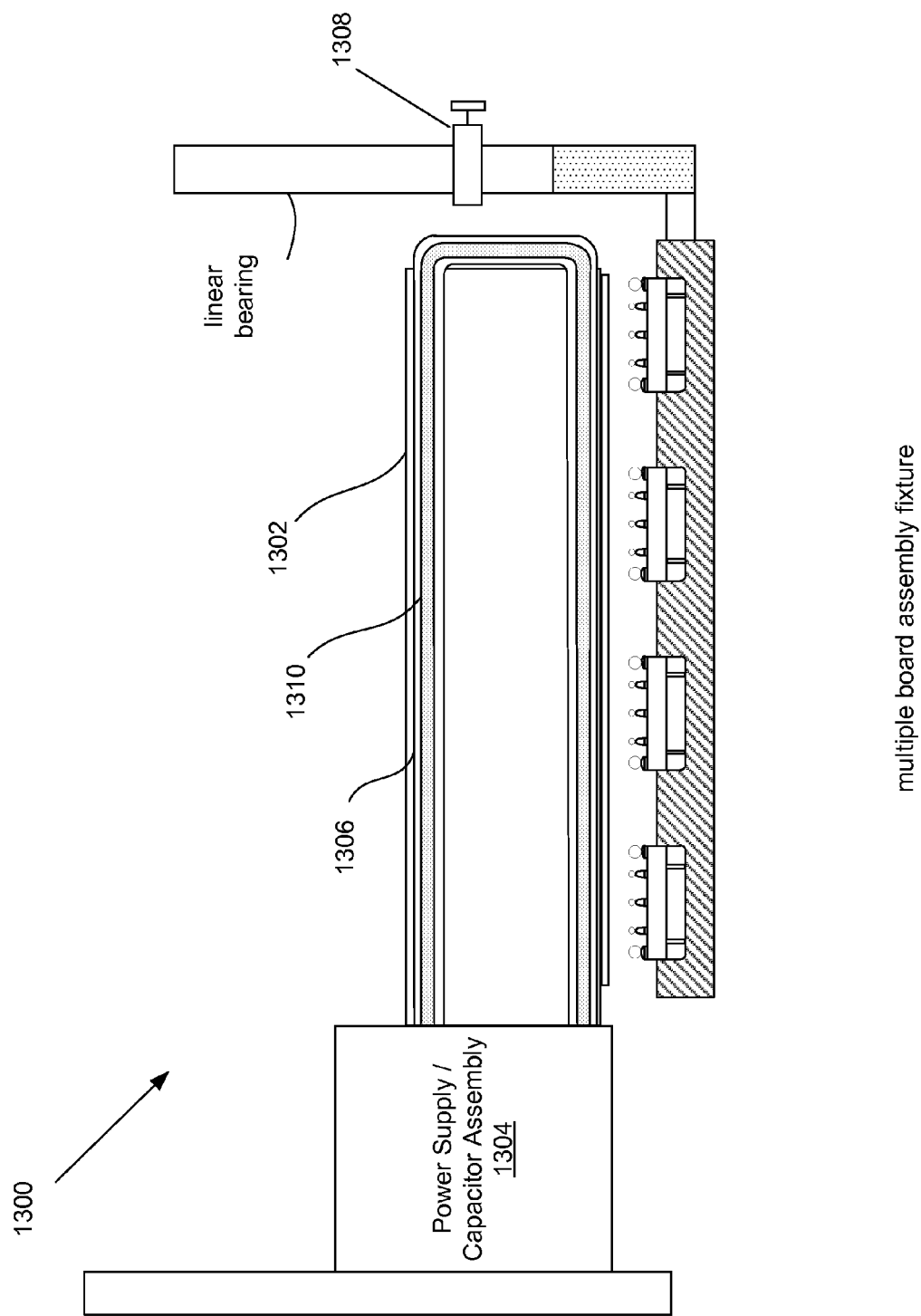
FIG. 13 shows a cross sectional view of yet another induction heater system.

FIG. 13 shows a cross sectional view of an embodiment of an induction heater system 1300. In system 1300, stiffener 1302 is coupled directly to power supply/capacitor assembly 1304. In this way induction coil 1306 can be rigidly attached to its power supply and the induction coil portion of induction heating system 1300 can be vertically adjusted if necessary, since the system is embodied in a single assembly. Another improvement to this embodiment is the addition of stage micrometer 1308. Stage micrometer 1308 allows for slight adjustments to be made to the assembly holding the PCBs. For example, by adjusting the vertical height of the stage an engineer on the assembly could make fine adjustments to the machine where there was a case of either too much or too little pressure being applied to the PCB boards during the welding operation. Finally, water cooling pipe 1310 is depicted in this embodiment. Water cooling pipe 1310 allows induction coil 1306 to be efficiently cooled during operating periods. In this embodiment water cooling pipe 1310 runs through the center of induction coil 1306. In other embodiments it might run through a channel built into the top of the induction coil. The positioning of water cooling line 1310 would be variable depending on the geometry and shape of induction coil 1306.

FIGS. 14A-17 show various embodiments of wire comb used in an induction wire attach system in accordance with the described embodiments. In particular, FIG. 14A shows a top view of induction based wire attach system 1400 that can include at least high temperature wire comb 1402. In the described embodiment, wire comb 1402 can be formed of non-conductive high temperature resistant material such as Kapton™. Wire comb 1402 can be arranged to provide support for a plurality of wires 1404 that are supported by wire jacket 1406 as part of cable 1408. In a solder based wire attach process, solder paste (not shown) can be applied to area 1410 between wires 1404 and PCB 1412 as shown in the side view of FIG. 14B. Wire comb 1402 can be size to accommodate various number and sizes of wires to be attached to PCB 1412. For example, in the embodiment shown in FIG. 14B, wire comb 1402 can have a typical height of about 0.1-0.2 inches providing support of wires 1404 during the induction heating of solder paste 1414. In order to prevent interference between adjoining wires, FIG. 15A shows a front view 1500 of wire comb 1402 highlighting various notches 1502 each having a size and shape in accordance with a single wire. The notches can be spaced apart to avoid interference between adjacent wires. For example, a typical inter-notch spacing can be on the order of about 0.01 inches. In the embodiment shown in FIG. 15A, wires 1506 can take on a circular shape in which case the corresponding notch has a size and shape such that each wire 1506 can be press fit into each notch. In this way, an operator can easily assembly the wires into wire comb 1402 efficiently and with a minimal chance of any two wires interfering with each other.

FIG. 15B shows another embodiment of the wire comb in the form of wire comb 1520 having notches 1522 that are rectangular in shape. Accordingly, in those situations where wires 1524 have been tinned with a resulting rectangular cross section, the tinned wires 1524 can be notch fitted into the correspondingly shaped notch 1526. In this situation, during the soldering process, the solder paste heated by an inductive heater will wick up to and capture wire 1524 notch fitted into notch 1526.

Turning to FIG. 16 showing a cross sectional view of wire attach system 1400 highlighting the relationship between induction heating source 1600, wires 1404, comb 1402, and solder paste 1414. As can be seen, the heat generated in the vicinity of wire comb 1402 (about 250 degrees C.) is substantially less than that that can be tolerated by wire comb 1402 when formed of, for example, Kapton™ (resistant to temperature of at least about 450 degrees C.). Therefore, wire comb 1402 can be used without being damaged by the heat generated by induction heating source 1600.

Figure 17:
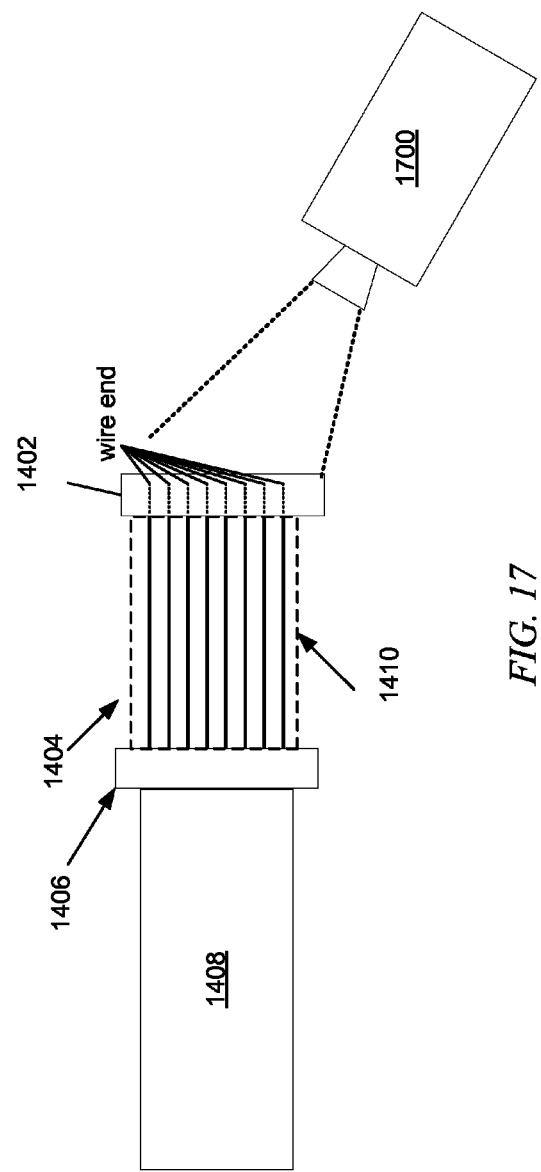

FIG. 17 shows another embodiment of wire attach system 1400 that includes camera 1700 that can be used in real time to evaluate and monitor the wire attach process. In particular, camera 1700 can view the placement of wires 1404. In this way, any misplaced or out of alignment wire can be easily detected and rectified prior to the start of the wire attach process.

Figure 18:
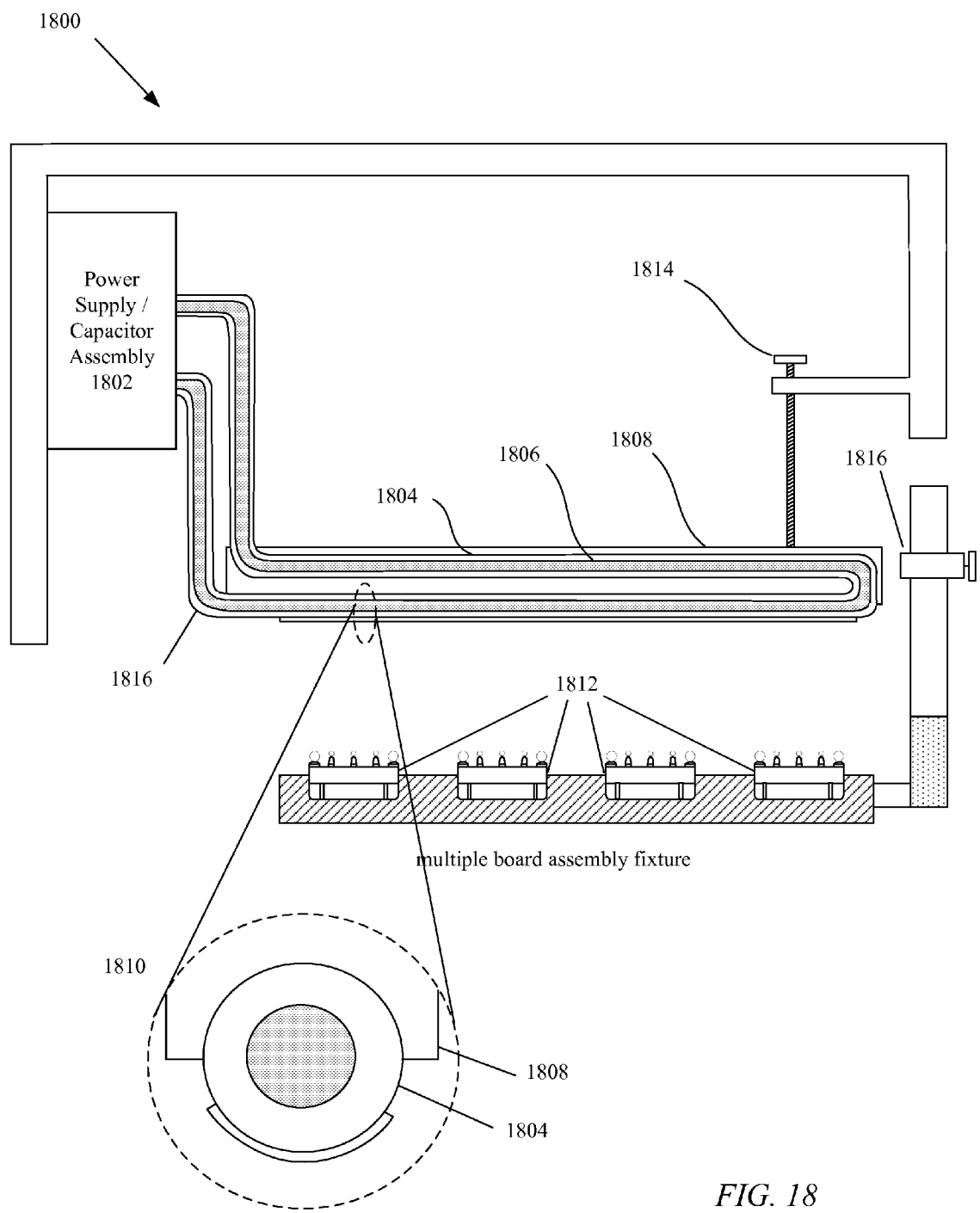
FIG. 18 shows a cross sectional view of an induction heater system configured to bond multiple PCB boards, with adjustments included to assist in precise alignment of the induction coil and PCB boards.

FIG. 18 shows yet another embodiment of induction heater system 1800. Induction heater system 1800 includes power supply/capacitor assembly 1802 which powers induction coil 1804. Induction coil 1804 has a cooling system 1806 which operates by running cool water through a center portion of induction coil 1804 and prevents overheating while induction coil 1804 is in operation. In some cases induction coil 1804 can be made of copper and have a diameter of about 3 mm. When induction coil 1804 is configured as described it may need additional mechanical support to prevent any drooping in the coil itself. In this embodiment stiffener 1808 can fulfill this purpose. Stiffener 1808 can be made of a non-conductive material such as for example solid $Al_2O_3$ ceramic. In this particular embodiment stiffener 1808 can enclose a top portion of the lower portion of induction coil 1804 as shown in cross sectional view 1810. This allows induction coil 1804 unobstructed contact with the targeted wires. When using an induction heater on multiple board assembly fixtures proper alignment between induction coil 1804 and PCBs 1810 is crucial to achieving a good bond. Improper alignment could result in the magnetic induction field over or under heating the solder resulting in quality control issues with the resulting bonds. Height adjustment knob 1814 can be mechanically coupled to a right side of stiffener 1808. Height adjustment knob 1814 allows fine adjustment of the elevation of right side of stiffener 1808. Since bend 1816 in induction coil 1804 is unsupported by stiffener 1808, micro adjustments in height adjustment knob 1814 will allow bend 1816 to bend slightly and the bending will result in an overall change in the angle of induction coil 1804 in relation to PCBs 1812. Stage micrometer 1816 can also be used to make micro adjustments in the orientation and position of the fixture holding PCBs 1812. Finally, either the PCB holder, the induction coil assembly or both may be moved vertically during the bonding operation to achieve a proper bonding position against the wires on PCBs 1812.

Figure 19A:
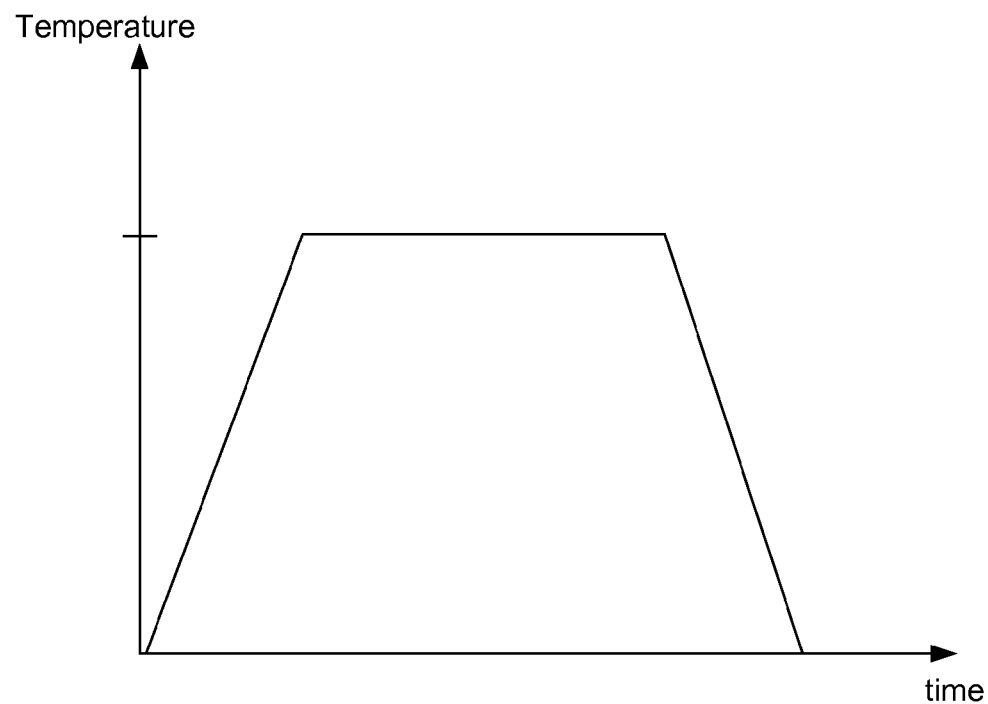
FIGS. 19A and 19B show how the use of a pyrometer for feedback control can create a more precise energy input into the induction coil.

FIG. 19A shows a graph displaying one embodiment where a ramp up and ramp down of temperature during the induction bonding process is controlled. The y-axis shows temperature and the x-axis shows time. The induction bonding process generally takes between 3 and 4 seconds to complete. In some bonding scenarios the rate of temperature increase may be important for bond strength or protection of neighboring electrical components. Alternating current power supplies coupled to induction coils may not have fine control parameters for creating a precise curve. A basic power supply for example might be designed to just output a certain amount of power. In cases where final control is desired a form of feedback control can be introduced to optimize the shape of the curve. A thermal camera, commonly called a pyrometer, can be used to optically measure the heat generated by the induction coil. By aiming the pyrometer at a point in the PCB accurate temperature profiles can be determined. This can be valuable for creating a preset power ramp for the power supply, or even for providing a real-time feedback loop of data to the power supply which allows the power supply to provide the amount of energy to the induction coil needed to achieve the desired temperature ramp up and ramp down.

Figure 19B:
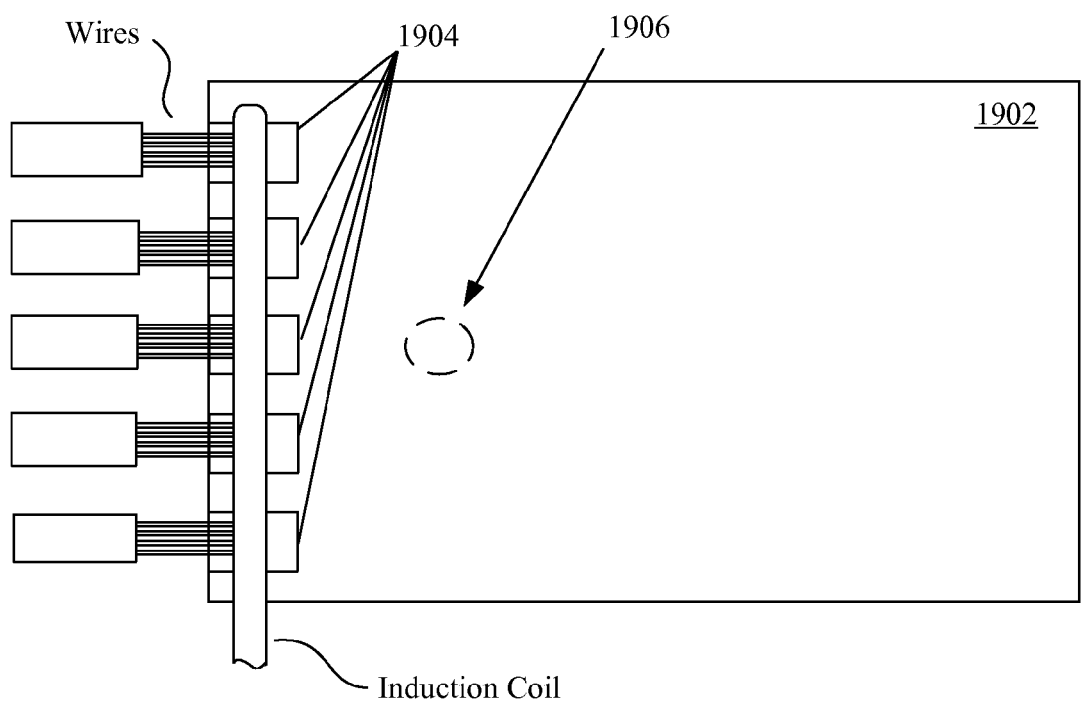

FIG. 19B shows a top view of a PCB during an inductive bonding operation. The pyrometer described in the preceding paragraph can be positioned directly above the PCB giving it a clear view of the entire PCB 1902. A pyrometer is most effective at determining temperatures of high emissivity objects, such as for example a PCB. In the present embodiment the pyrometer would not be as accurate focusing on PCB pads 1904 as copper or any other metallic material the PCB Pad could be made of typically has low emissivity properties. Instead a pyrometer could focus on area 1906 of PCB 1902 which as previously stated tends to have high emissivity properties. Instead of linking the feedback control to the absolute temperature of the PCB Pads a look up table could be created which would associate various PCB area 1906 temperatures with PCB pad temperatures, thereby giving the rapid feedback necessary to generate a well defined ramp up and ramp down profile as described in FIG. 19A. The use of a pyrometer could be somewhat simpler in situations where induction bonding was applied to a ceramic such as $Al_2O_e$. In this case as the ceramic has a high emissivity highly accurate monitoring could be achieved simply by pointing a pyrometer at the applicable area of interest on the ceramic being bonded.

In yet another embodiment the adhesive glue can be replaced by nano-sintered material. The nano-sintered material can be made from a combination of powdered metals such as cooper, aluminum, and silver broken down into nano-sized particles. In one embodiment nano-sintered material can be nano-sintered aluminum having a grain diameter of about 77 nanometers. By breaking the elements into such small size the surface area to volume ratio is increased to a point where the melting temperature drops to closer to 200 degrees Celsius, or roughly the same temperature as the adhesive glue. Use of the metals in their elemental forms would be difficult at best as in some cases they would need to be heated to about 500 degrees Celsius. An induction coil can be used to heat the nano-sintered materials just as it was previously described to heat the adhesive glues. The resulting bond is generally metallic and typically of a higher quality than those bonds achieved with adhesive materials. The use of nano-sintered material also avoids problems created by electromigration. Yet another advantage of the nano-sintered materials is that the resulting bond can be much shorter in height. Since the bond is of a superior strength it allows for a smaller Z height of resulting consumer electronic devices. Another alternative to adhesive glue is nano foil. A sheet of nano foil can be formed from a number of stacked layers of aluminum and nickel. Instead of using resin based adhesives a small sheet of nano foil can be placed between the PCB pad and tinned wires. In one embodiment PCB pad can have an upper surface coated with Electroless Nickel Immersion Gold (ENIG). While nano foil is typically activated with a large amount of electricity from a power source such as a 9V battery, a high energy induction coil can also be used to quickly create enough energy to activate the nano foil. Once activated the nano foil undergoes an exothermic reaction at which point it heats its surroundings up to a temperature of about 1000 deg Celsius for a matter of micro seconds. The heat beneficially allows the PCB pad coated with ENIG to bond securely to the tinned wires.

Figure 20:
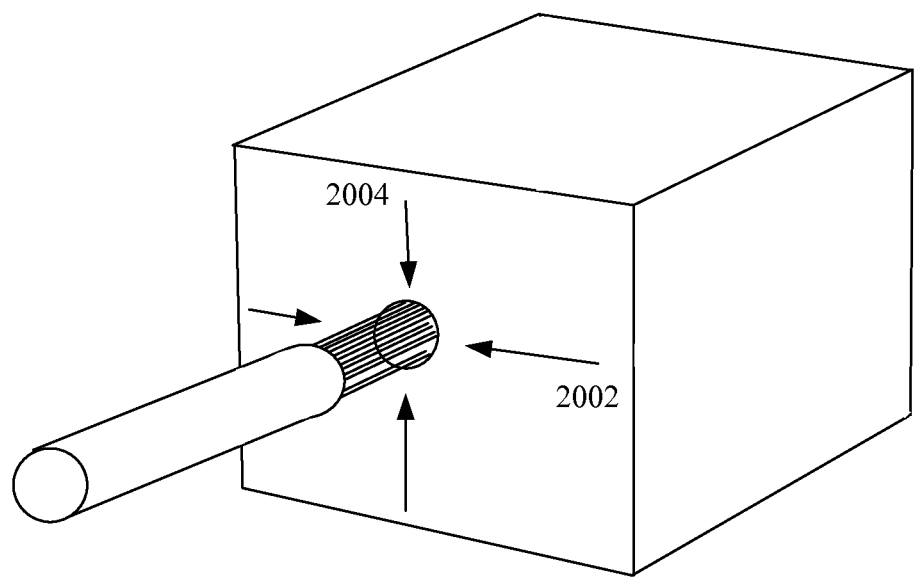
FIG. 20 shows a perspective view of a swaging machine for merging stranded wires prior to an ultrasonic bonding operation.

Another way to overcome the electromigration problems associated with the use of adhesive is to design a configuration in which no actual mechanical contact is required and the attachment occurs without the use of adhesives. Ultrasonic welding is one process which can be carried out without contact between the bonder and the PCB pad. Ultrasonic frequencies are vibrations which occur above the level discernable by the human ear. This frequency range is regarded as being any frequency greater than 20 kHz. Ultrasonic welders vibrate at an ultrasonic frequency that causes resonation in wires of a particular thickness. Generally, the frequency of the ultrasonic welders increases as the diameter of the wires to be bonded get smaller. An ultrasonic welder configured to weld a single wire generally contains a cavity which fits above a wire arranged on the surface to be welded. When the ultrasonic welder is activated the wire quickly bonds to the substrate. The resulting attachment tends to be electrically and mechanically superior to bonds created in soldering operations. These ultrasonic mechanical vibrations applied have been shown to be capable of cold fusing metal wires to a metal substrate, even where the metals have different material properties. By making a direct connection between the wire and the metal substrate an entire layer of resistance is removed, and any possibility of weakening of a solder joint is also eliminated. Unfortunately, this process has been limited to single wire configurations. One way to avoid the complexities involved with multi wire ultrasonic bonding is to bond the wires together before the ultrasonic bonding operation. One method of bonding the wires together is by physically squeezing the wires together by way of a tool called a swager. A swager is shown in FIG. 20. Horizontal forces 2002 and vertical forces 2004 can be applied to a group of exposed wires resulting in a single amalgam of the previously individual wires. An ultrasonic bonder can then bond the unified wire to a PCB pad. Yet another method that requires less mechanical force and potential for physical damage to the exposed wires is arc welding the wires together prior to an ultrasonic bonding operation.

Figure 21:
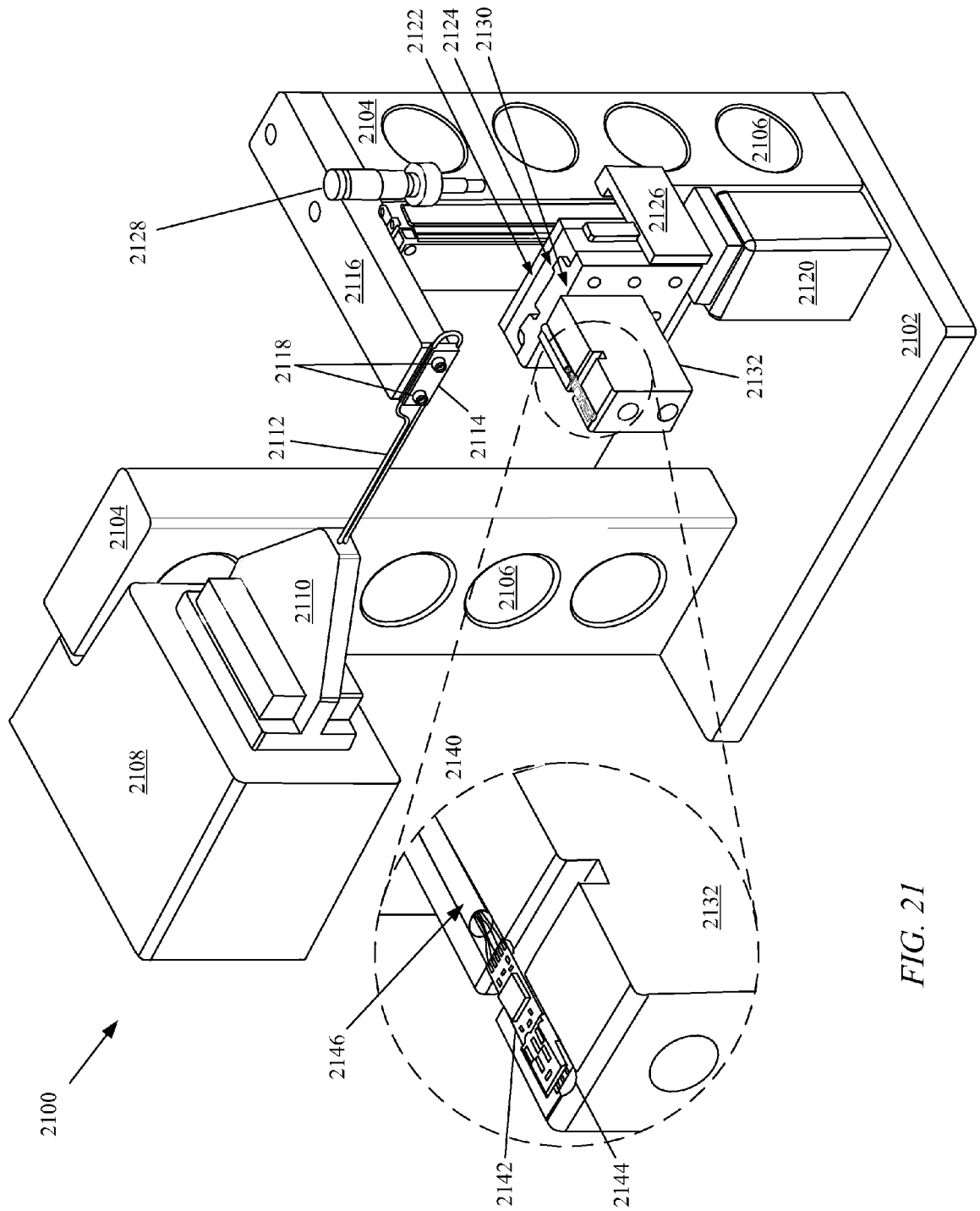
FIG. 21 shows a perspective view of one embodiment of an induction bonding machine with the PCB nest in a lowered position.

FIG. 21 shows a perspective view of another embodiment of the described embodiment. Here induction bonding machine 2100 is mounted upon base plate 2102. Base plate 2102 provides a stable, flat base for supporting pillars 2104. Support pillars 2104 can be made of a rigid material such as steel. Holes 2106 in support pillars 2104 can be optionally included in support pillars 2104 to reduce the overall weight of induction bonding machine 2100. Heating head 2108 provides high frequency alternating power to water combiner 2110. Heating head 2108 can have a fixed alternating current output of greater than 700 kHz. Water combiner 2110 receives high frequency current from heating head 2108 and transmits it to induction coil 2112. Water combiner 2110 also pumps cooling water through a hollow portion of induction coil 2112 to keep induction coil 2112 cool while it operates. In this particular configuration induction coil 2112 can have an outer diameter of between 2 and 3 mm. Induction coil 2112 is attached to stiffener 2114. Stiffener 2114 can be made from non-conductive material such as plastic or ceramic material that will not interfere with magnetic field lines emanating from induction coil 2112. For example, $Al_2O_3$ is one ceramic that could be used and PEEK (Polyetheretherketone) is a plastic that could be used to form stiffener 2114. Stiffener 2114 can be attached to beam 2116 by securing screws 2118. Beam 2116 and securing screws 2118 are also made of non-conductive materials to reduce field interference and energy dissipation problems that would be caused by conductive support structures located too close to induction coil 2112. Securing screws 2118 allow an operator to make minor adjustments to the orientation of stiffener 2114 and induction coil 2112. The advantages of this flexibility will be described in the next figure. Beam 2116 is mechanically coupled to support pillar 2104.

Linear bearing 2120 is supported by base plate 2102. Linear bearing 2120 can also be mechanically coupled to support pillar 2104 for increased support and alignment. Linear bearing 2120 can be a servo operated off the shelf component for precisely moving an assembly up and down. Linear bearing 2120 can be attached to adapter plate 2122. Adapter plate 2122 allows a custom made primary stage 2124 to be mechanically coupled to adapter plate 2122. Primary stage 2124 can also be mechanically coupled to limit stop 2126. Limit stop 2126 is designed to engage micrometer 2128 as primary stage 2124 is raised up by linear bearing 2120. Primary stage 2124 is also connected via a leaf spring to secondary stage 2130. Secondary stage 2130 is then mechanically coupled to PCB nest 2132. PCB nest 2132 is made of non-conductive material such as ceramic or plastic. In this particular embodiment PCB nest 2132 is only configured to accept one PCB; however, PCB nest 2132 can be widened to accept a number of PCBs where faster production times are desired. Close up view 2140 shows PCB 2142 sitting in PCB nest channel 2144. Cable jacket 2146 can also sit in PCB nest channel 2144 as shown. Cable jacket 2146 can contain all the wires to be attached to PCB 2142.

Figure 22:
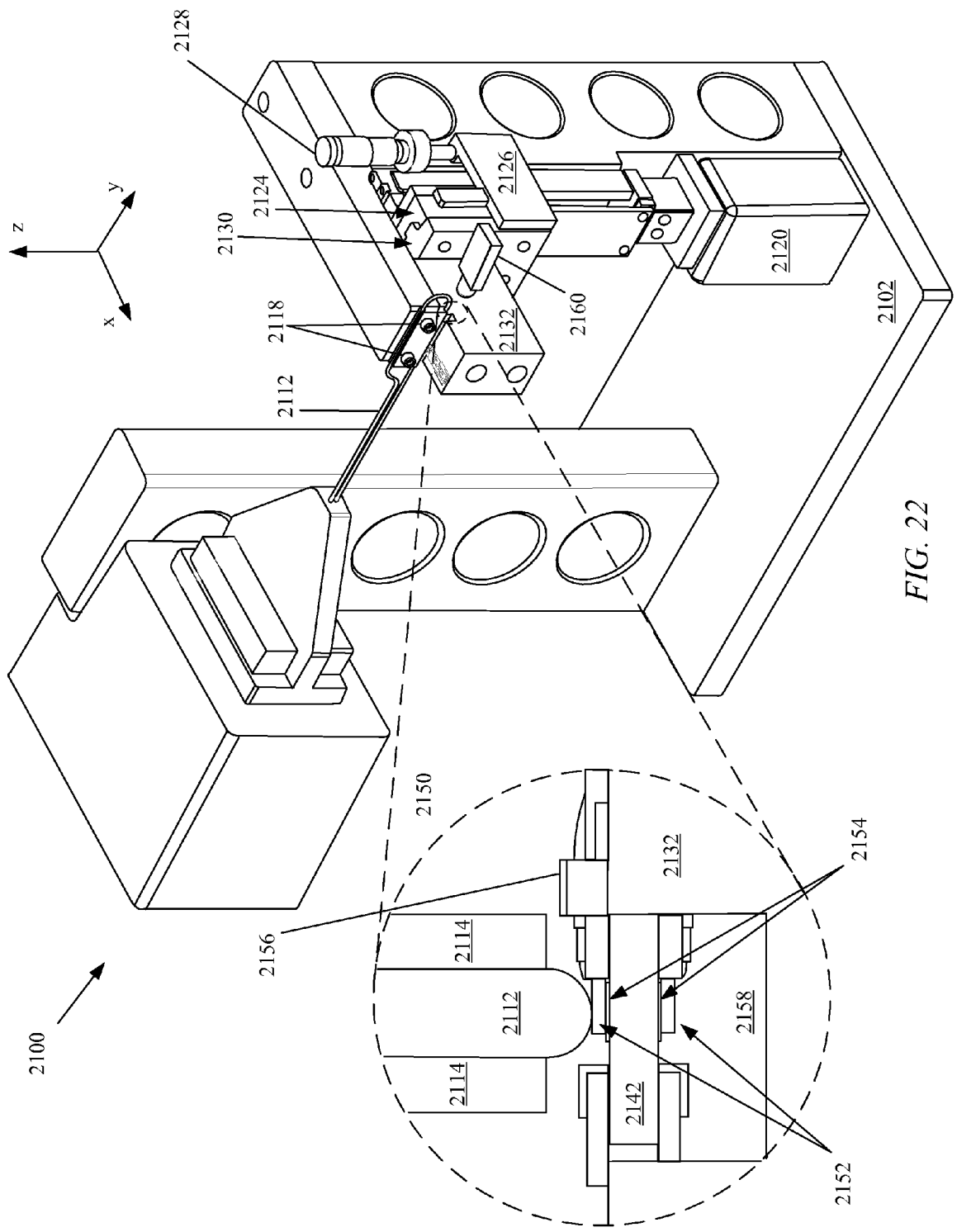
FIG. 22 shows a perspective view of the induction bonding machine of FIG. 21 with the PCB nest in a bonding position.

FIG. 22 shows another perspective view of induction bonding machine 2100. Here linear bearing 2120 has been used to put PCB 2142 into contact with induction coil 2112. In this view we see micrometer 2128 has come into contact with limit stop 2126. This portion of induction bonding machine 2100 is important as part of an initial calibration process. Limit stop 2126 is designed to stop primary stage 2124 at a point where secondary stage 2130 can put PCB nest 2132 into a position to cause PCB 2142 to come into contact with induction coil 2112. Because secondary stage 2130 is connected to primary stage 2124 via a leaf spring, precise positioning of primary stage 2124 is not crucial; this is because secondary stage 2130 can travel a range of a couple of millimeters in the vertical direction if primary stage 2124 is slightly misplaced. This can be beneficial when for example, linear bearing 2120 starts wearing in and its ultimate position changes. In this case the spring built into secondary stage 2130 would allow PCB Nest 2132 to still reach induction coil 2112. Once induction coil 2112 is in contact with PCB 2142 a key may be turned that locks secondary stage 2130 into place essentially locking it rigidly to primary stage 2124. Once the locking step is complete micrometer 2128 can be used to make fine adjustments to achieve the desired the pressure between PCB 2142 and induction coil 2112. Once this initial calibration step is complete operations can be conducted rapidly as it allows operators to achieve repeatable and precise positioning of induction coil 2112. This kind of calibration process could be carried out at the beginning of each work shift to facilitate proper positioning of induction coil 2112.

Close up view 2150 shows induction coil 2112 in contact with stranded wires 2152, and stranded wires 2152 positioned on top of PCB pad 2154. Here about half of induction coil 2112 sticks out of stiffener 2114 allowing direct contact between induction coil 2112 and stranded wires 2152. In other embodiments the cross section of induction coil 2112 could be rectangular, allowing more surface area contact between induction coil 2112 and stranded wires 2152. In certain cases further fine calibration of induction coil 2112 may be needed to put induction coil 2112 into full contact with all the wires connecting to PCB 2142. One way to accomplish this is by adjusting securing screws 2118. An operator can loosen securing screws 2118, and then adjust stiffener 2114. Since induction coil is made of copper and only about 2-3 mm in outer diameter, induction coil 2112 is flexible enough to be bent and maneuvered with stiffener 2114 in the y-z plane. In an alternate embodiment stiffener 2114 can have a number of holes in it allowing an operator to precisely maneuver stiffener 2114 by moving securing screws 2118 between holes.

Wire routing assembly 2156 for aligning each set of stranded wires 2152 over its associated PCB pad 2154 can be seen in close up view 2150. Channel 2158 is also shown. Channel 2158 allows the underside of PCB 2142 to be exposed to natural air flow facilitating cooling during and after the induction bonding process is carried out. Channel 2158 also exposes the wire attachment positions on the underside of PCB 2142. In this embodiment wires can be bonded to both sides of PCB 2142. After a first bonding operation is completed on one side, PCB 2142 can be flipped over and bonding operations can be carried out on the underside of PCB 2142. Monitoring cameras can be configured to have a field of view of about the same area shown in close up view 2150. Camera assembly 2160 is positioned to have a view similar to that view shown in close up view 2150. Camera assembly 2160 can be mounted on a separate support structure (not shown) attached to base plate 2102. Camera assembly 2160 can be a high speed close-up visible light lens that would allow an operator to have a detailed view of the bonding process in real time. Bonding operations could also be played back to allow operators to see where a particular bonding operation may have gone wrong. Another monitoring camera can be mounted just above camera assembly 2160. This second camera could be embodied by the pyrometer described in conjunction with FIG. 19. As previously described, this would provide a feedback control signal to heating head 2104 thereby enabling fine control over the amount of energy supplied to induction coil 2112.

Figure 23:
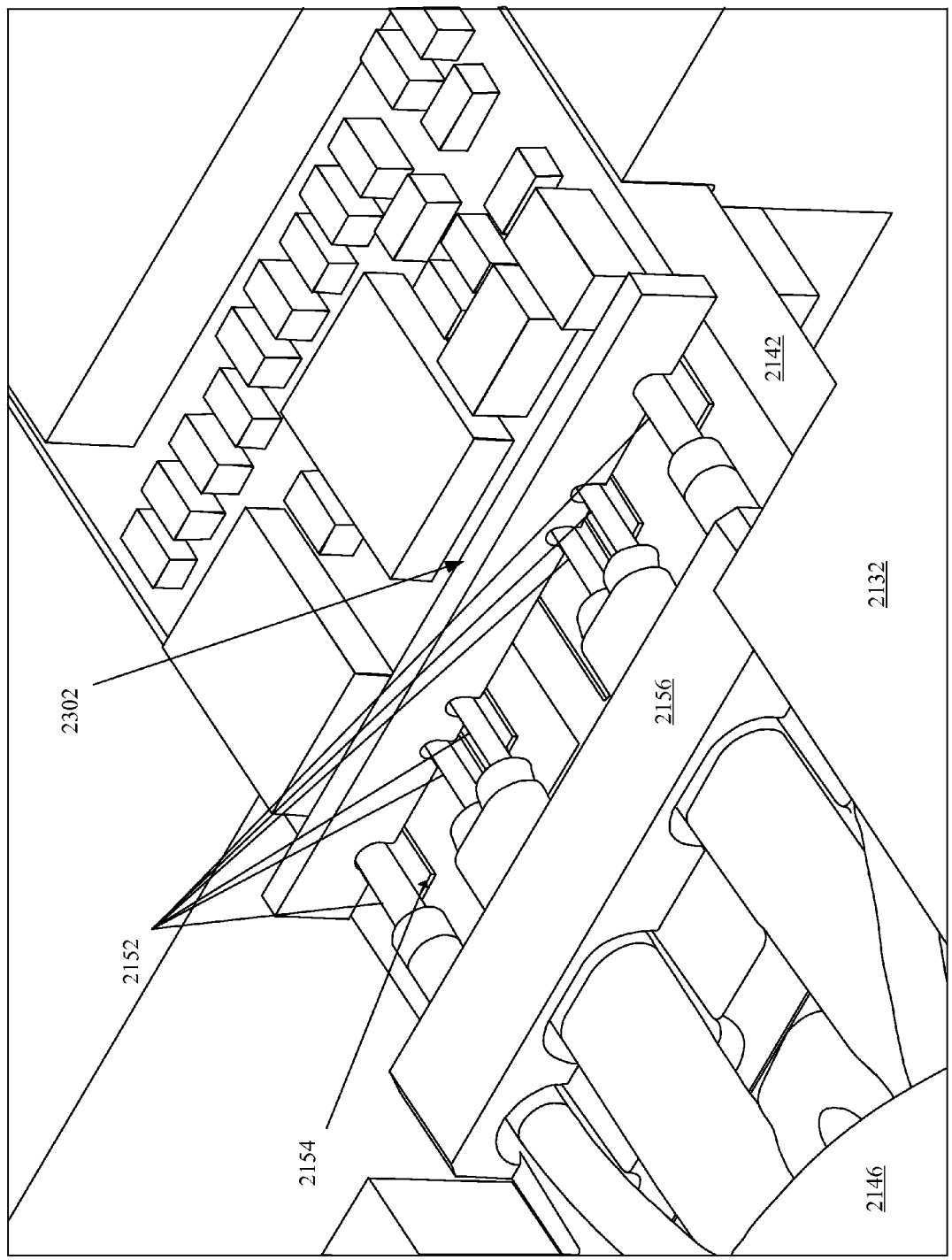
FIG. 23 shows a perspective view of one embodiment of a wire tip alignment device for the induction bonding machine of FIG. 21.
Figure 24:
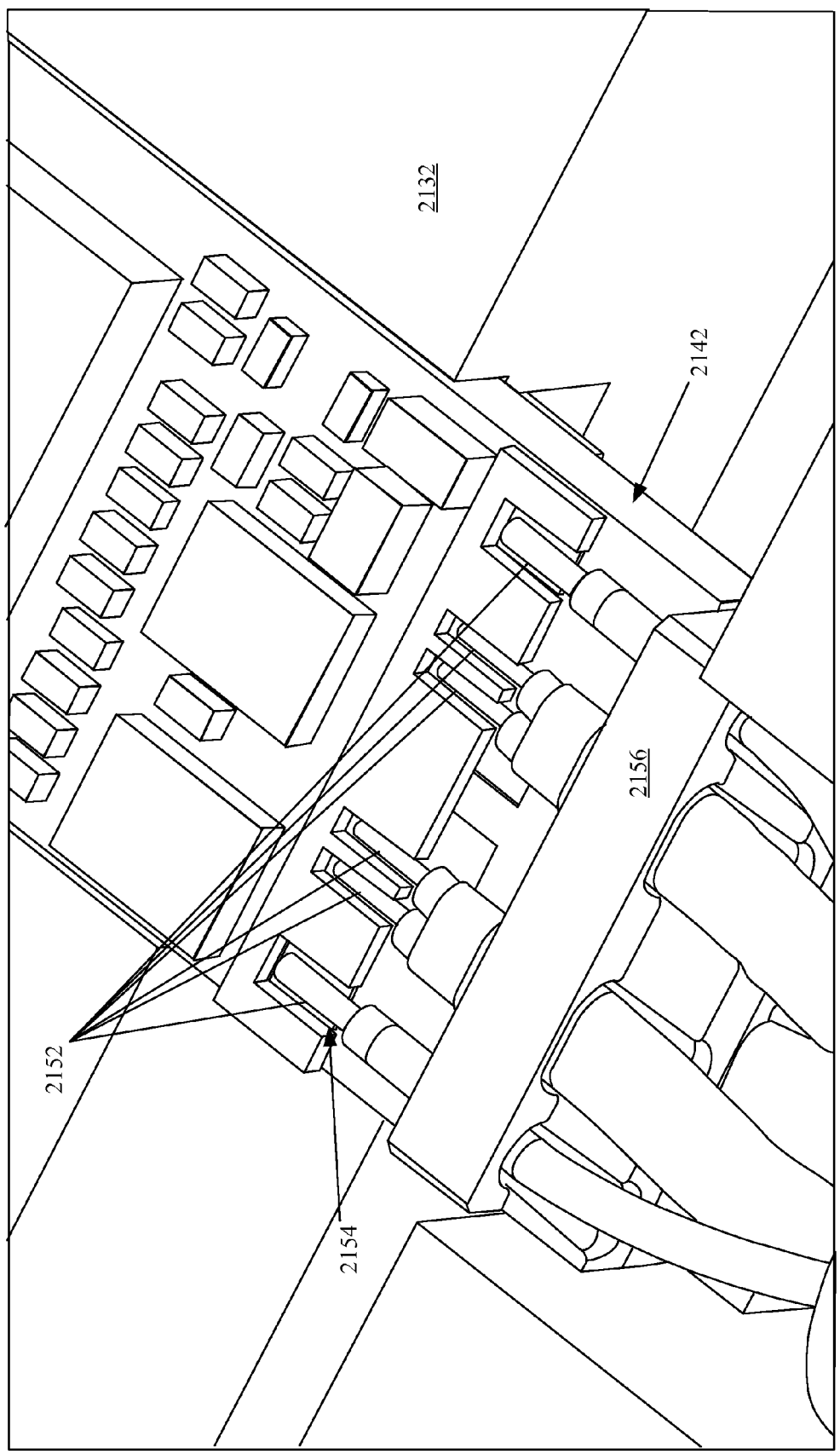
FIG. 24 shows a perspective view of another embodiment of a wire tip alignment device for the induction bonding machine of FIG. 21.

FIG. 23 shows a perspective view of stranded wires 2152 arranged on PCB pads 2154. In this embodiment of the described embodiment wire comb 2302 has been added to keep stranded wires 2152 aligned on PCB pads 2154. Wire comb 2302 can be made of any sufficiently solder phobic, non-magnetic material, such as high temperature Kapton™ or ceramic material. In this embodiment wire comb 2302 can be placed across stranded wires 2152 before an inductive bonding operation is conducted. After the bonding operation is complete wire comb 2302 can be removed from the top of PCB 2142. In FIG. 24 another perspective view of stranded wires 2152 is shown. Here an alternate variation of wire comb 2302 is shown, marked in FIG. 24 as wire comb 2304. Wire comb 2304 as shown facilitates lateral alignment of stranded wires 2152. Wire comb 2304 can be put into place on PCB 2142 before stranded wires 2152 are placed on PCB pads 2154. When an operator or machine routes stranded wires 2152 through wire routing assembly 2156 and places stranded wires 2152 in contact with PCB pads 2154, wire comb 2304 provides a well defined channel for stranded wires 2152 to sit in. While wire comb 2304 does not prevent stranded wires 2152 from displacing in the vertical direction, induction coil 2112 (not shown) can put pressure on the tops of stranded wires 2152 during a bonding operation, thereby keeping stranded wires 2152 from displacing vertically. It should be noted that while stranded wire 2152 are depicted as solid wires in FIGS. 23 and 24 in actuality they represent a number of bundled wires that in some cases can have individual wires with outer diameters as small as about 7 microns. In some cases the tips of stranded wires 2152 can be dipped in tin to merge the small diameter wires together thereby preventing separation of the small wires, and helping to facilitate inductive coupling during the inductive bonding operation.

Figure 25A:
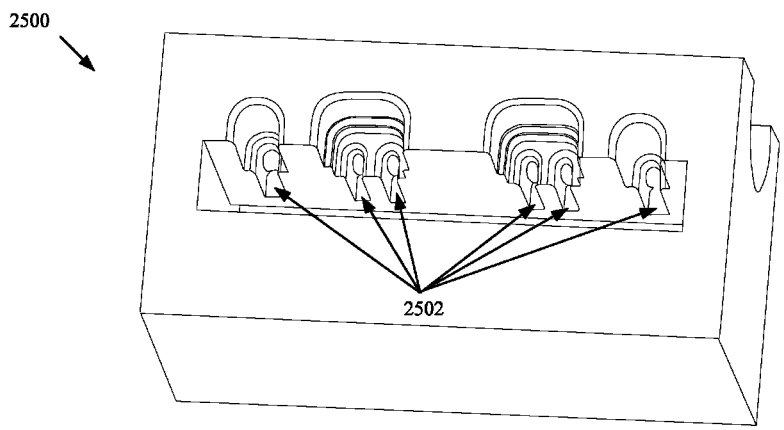
FIGS. 25A and 25B show various features of a three dimensional wire comb for use in accordance with the described embodiment.
Figure 25B:
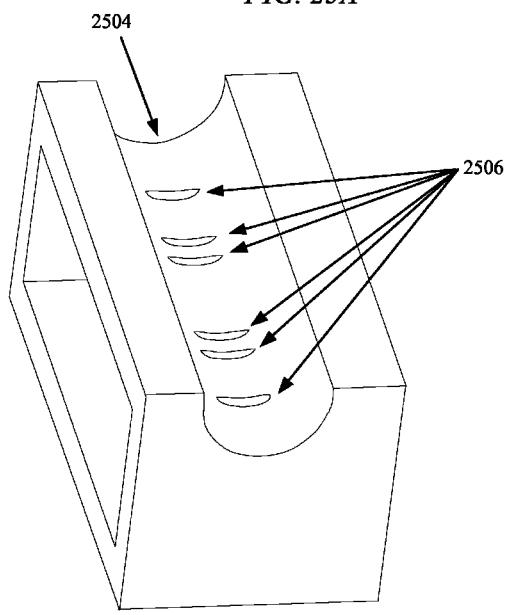

FIGS. 25A and 25B show a three-dimensional wire comb. In FIG. 25A a perspective view of wire comb 2500 is shown. In this illustrated embodiment wire guide 2500 has wire alignment features 2502 for six strands of wire. Wire comb 2500 can be composed of a nonconductive material and in cases where the material is not inherently solder phobic, coated with a solder phobic film such as Kapton™. In some cases, wire comb 2500 can be made of ceramic material. Wire comb 2500 is designed to fit over one end of a printed circuit board while an inductive bonding operation takes place. Wire alignment features 2502 allow each of the six strands of wires to be channelized above a PCB pad thereby preventing individual strands from undergoing any undesirable misalignment during the bonding operation. In FIG. 25B another perspective view of wire comb 2500 is illustrated. From this view, coil support channel 2504 is shown. Coil support channel 2504 allows an inductive coil (not shown) to rest securely during a bonding operation. In this way coil support channel 2504 provides a stable position for an inductive coil placing the inductive coil at a predictable distance from the strands of wire aligned by wire alignment features 2502. FIG. 25B also shows wire cut outs 2506 arranged along the surface of coil support channel 2504. Wire cut outs 2506 expose the portions of the strands of wire to be bonded during a bonding operation. In this way wire comb 2500 can achieve its alignment purposes without inhibiting the inductive coupling between the induction coil and the strands of wire.

Figure 26A:
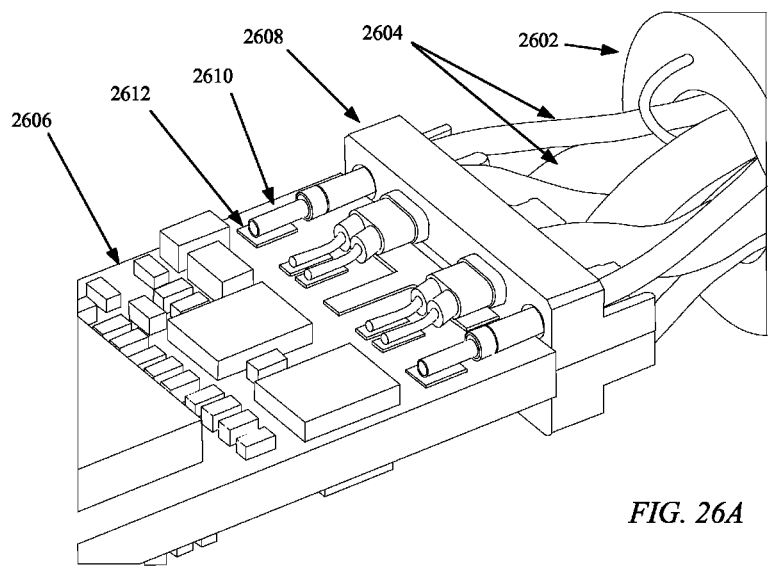
FIGS. 26A and 26B show how the three dimensional wire comb from FIGS. 25A and 25B can be used to facilitate an inductive bonding operation on a PCB in accordance with the described embodiment.
Figure 26B:
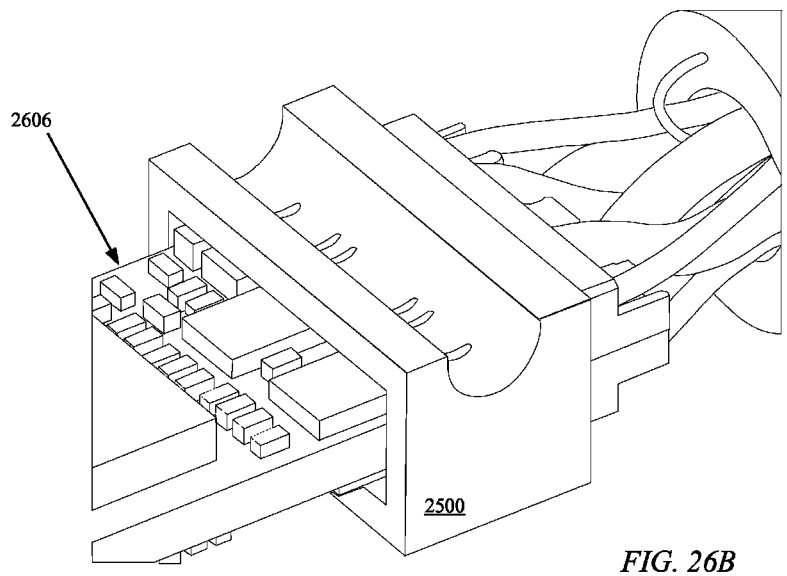

FIG. 26A shows a perspective view of a PCB with stranded wires ready to be bonded to a set of PCB pads. In FIG. 26A a multi-wire jacket 2602 is shown carrying a number of insulated wires 2604. Insulated wires 2604 are then aligned with PCB 2606 by wire alignment fixture 2608. Wire ends 2610 of insulated wires 2604 are exposed and arranged on corresponding PCB pads 2612. Wire ends 2610 generally contain numerous individual strands of wire which all need to be electrically coupled to a corresponding PCB pad 2612. In some embodiments wire ends 2610 will go through a previously described joining process in which the ends are fused together to prevent potential fraying and/or misalignment during an inductive bonding operation. FIG. 26B shows wire comb 2500 arranged over one end of PCB 2606. Wire comb 2500 can be arranged on PCB 2606 before wire ends 2610 are arranged on PCB pads 2612. In this way wire ends 2610 can be channelized directly onto PCB pads 2612 by wire alignment features 2502 (not shown).

Figure 27:
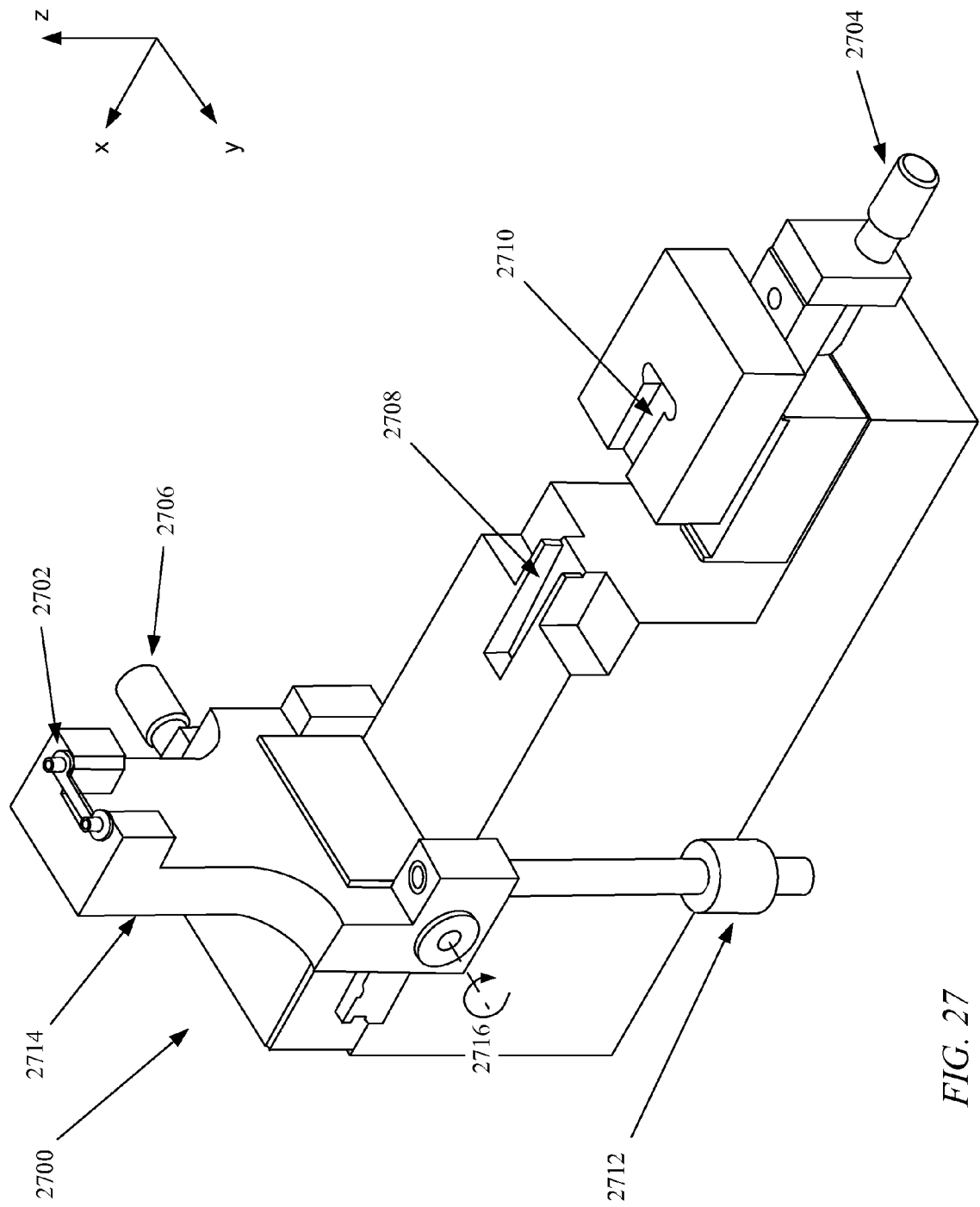
FIG. 27 shows a perspective view of an alternative PCB nest in an open position, including a wire comb and positional adjustment knobs for a PCB.

FIG. 27 shows a perspective view of an alternative PCB nest for an inductive bonding machine similar to inductive bonding machine 2100. PCB nest 2700 has integrate wire guide 2702 along with X and Y-axis adjustment knobs 2704 and 2706. PCB Nest also includes stranded wire channel 2708 and PCB channel 2710. Stranded wire 2708 leaves a channel for a bundle of wires to be arranged along prior to attachment to a PCB. PCB channel 2710 allows a recess for PCB to sit in as an inductive bonding operation is carried out. Adjustable counterweight 2712 is mechanically coupled to rotating wire comb assembly 2714. Rotating wire comb assembly 2714 rotates around axis 2716 allowing wire comb 2702 to settle on a PCB as will be shown in the next figure. By adjusting the position of adjustable counterweight 2712, pressure exerted by wire comb 2702 on a PCB can be modulated as required.

Figure 28:
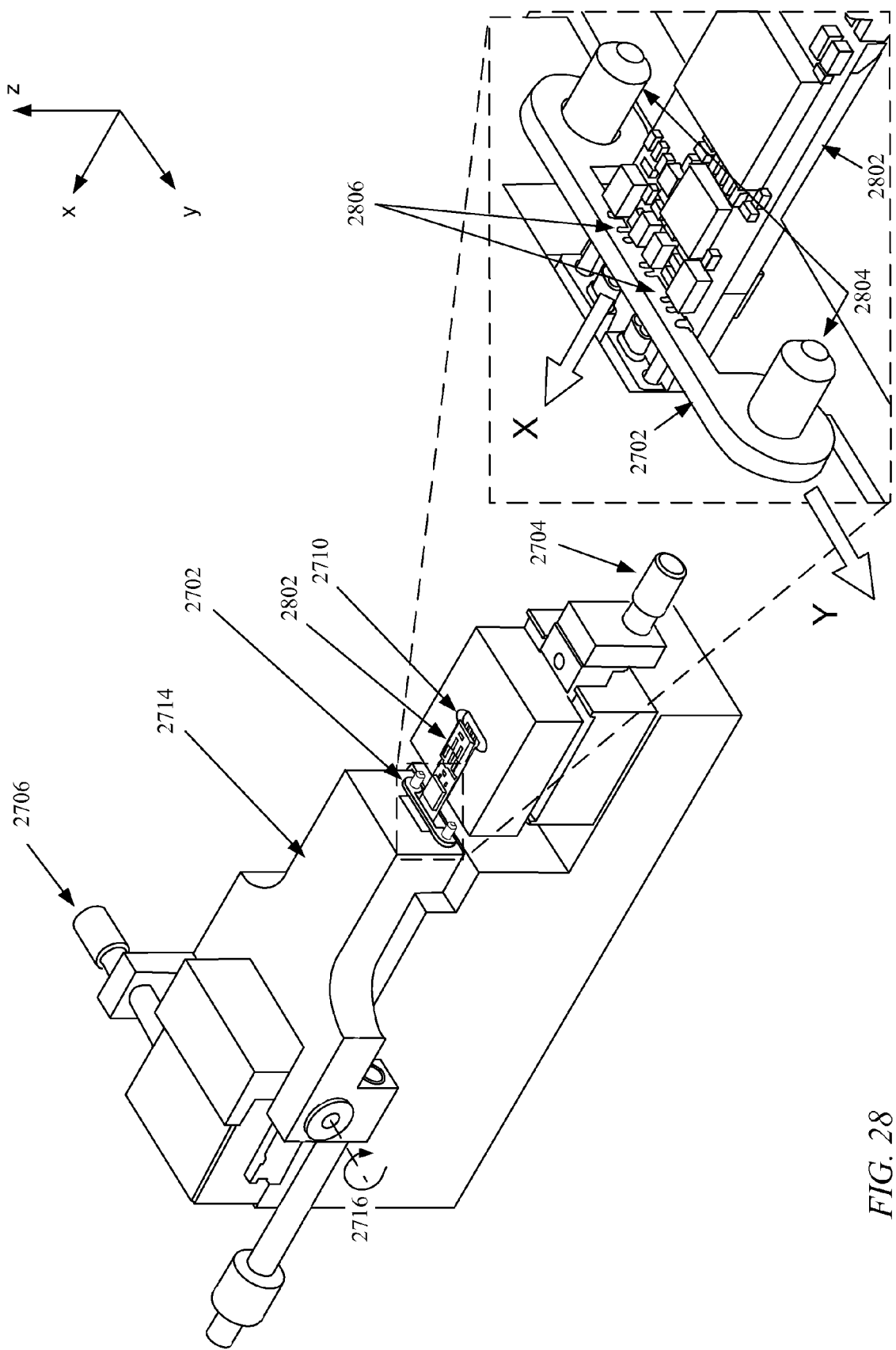
FIG. 28 shows a perspective view of the alternative PCB nest of FIG. 27 in a closed position.

FIG. 28 shows a perspective view of PCB nest 2700 in a closed position. Here wire comb assembly 2714 has been rotated through 90 degrees about axis 2716 to effectively cover stranded wire channel 2708 (not shown). PCB 2802 is shown arranged in PCB channel 2710. PCB 2802 can be moved with respect to wire comb 2702 by manipulating adjustment know 2704 and 2706, allowing movement in both the X and Y axes. The position of wire comb 2702 can also be manipulated with adjustment knobs 2804. Adjustment knobs 2804 can be used in aligning the initial orientation of wire comb 2702 with an upper surface of PCB 2802. Once properly situated wire comb 2702 should not need any further adjustments. Wire channels 2806 in wire comb 2702 keep wires in place on pads arranged on PCB 2802 during inductive bonding operations. In this particular embodiment an inductive coil can be brought into contact with wire ends arranged on PCB 2802. The inductive coil would be situated between wire comb assembly 2714 and wire comb 2702, running essentially parallel with wire comb 2702. In some embodiments wire comb 2702 can include magnetic concentrators to help direct a magnetic field emanating from the inductive coil thereby enabling a more finely formed magnetic field allowing for improvements in efficiency.

Figure 29:
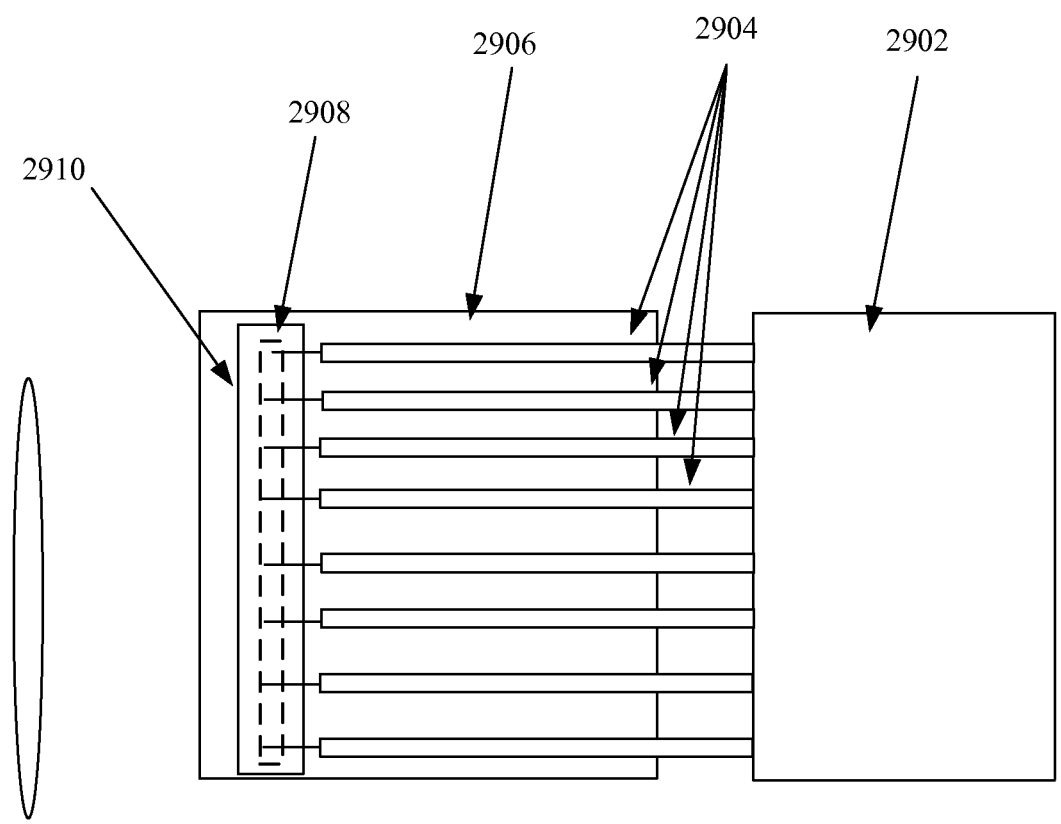
FIG. 29 illustrates a method for fusing the ends of stranded wires with a UV light curing adhesive and a UV light source.

FIG. 29 illustrates yet another way to fuse the wire ends of a stranded wire. Wire jacket 2902 can hold a number of stranded wires 2904. Stranded wires 2904 can be arranged on wire holder 2906. The ends of stranded wires 2904 can be dipped in UV light curing adhesive 2908. A UV light can then be directed at area 2910 for a duration sufficient to cure UV light curing adhesive 2908. Once cured, adhesive 2908 can effectively fuse the ends of stranded wires 2904 together, thereby preventing fraying or misalignment of stranded wires 2904 during inductive bonding operations. While the illustration shows only a handful of wires it should be noted that a large number of ends of stranded wires 2904 can be fused together in a single UV curing operation, allowing for large batch processing.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A method for bonding a plurality of wires to a metal substrate disposed along a top surface of a printed circuit board (PCB), the method comprising:

placing the plurality of wires upon the metal substrate;
applying inductive energy to solder the plurality of wires to the metal substrate;
monitoring a temperature of a portion of the PCB; and
varying an amount of inductive energy applied to the plurality of wires in accordance with a temperature of the monitored portion of the PCB.

2. The method as recited in claim 1, wherein the temperature of the monitored portion of the PCB is monitored by a thermal camera in real time.

3. The method as recited in claim 1, wherein the monitored temperature is utilized in conjunction with a lookup table to determine a temperature of the metal substrate during the bonding operation.

4. The method as recited in claim 1, wherein the monitored portion of the PCB has high emissivity properties.

5. The method as recited in claim 4, wherein the monitored portion of the PCB is adjacent to the metal substrate.

6. The method as recited in claim 1, wherein varying the amount of inductive energy comprises varying the amount of inductive energy to control a ramp up and ramp down of a temperature of the metal substrate during the bonding operation.

7. A method for bonding a plurality of wires to a metal substrate disposed on a printed circuit board (PCB), the method comprising:
placing the plurality of wires upon the metal substrate;
applying inductive energy to solder the plurality of wires to the metal substrate with an induction coil;
monitoring a temperature of a portion of the PCB adjacent to the metal substrate;
varying an amount of inductive energy applied to the wires in accordance with a temperature of the monitored portion of the PCB, wherein the amount of energy is varied by modulating an amount of alternating current applied to the induction coil during the bonding operation.

8. The method as recited in claim 7, wherein the temperature of the portion of the PCB is monitored by a pyrometer.

9. The method as recited in claim 8, wherein the pyrometer provides temperature to a feedback control system that varies the amount of inductive energy provided by the induction coil in real time.

10. The method as recited in claim 7, wherein the applying inductive energy to solder the plurality of wires to the metal substrate comprises applying inductive energy to solder a plurality of wires to a plurality of metal substrates.

\* \* \* \* \*